United States Patent
Hsu et al.

(10) Patent No.: US 11,476,159 B2
(45) Date of Patent: Oct. 18, 2022

(54) SHARED CONTACT STRUCTURE AND METHODS FOR FORMING THE SAME

(71) Applicant: Taiwan Semiconductor Manufacturing Co., Ltd., Hsinchu (TW)

(72) Inventors: Leo Hsu, Hsinchu (TW); Sheng-Liang Pan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 19 days.

(21) Appl. No.: 16/995,299

(22) Filed: Aug. 17, 2020

(65) Prior Publication Data
US 2020/0381298 A1    Dec. 3, 2020

Related U.S. Application Data

(60) Continuation of application No. 16/691,801, filed on Nov. 22, 2019, now Pat. No. 10,755,978, which is a division of application No. 16/032,390, filed on Jul. 11, 2018, now Pat. No. 10,510,600.

(51) Int. Cl.
| | |
|---|---|
| *H01L 21/768* | (2006.01) |
| *H01L 27/11* | (2006.01) |
| *H01L 23/528* | (2006.01) |
| *H01L 29/66* | (2006.01) |
| *H01L 21/027* | (2006.01) |

(52) U.S. Cl.
CPC .... *H01L 21/76897* (2013.01); *H01L 21/0275* (2013.01); *H01L 21/0276* (2013.01); *H01L 21/76843* (2013.01); *H01L 21/76895* (2013.01); *H01L 23/528* (2013.01); *H01L 27/1104* (2013.01); *H01L 29/66545* (2013.01)

(58) Field of Classification Search
None
See application file for complete search history.

(56) References Cited

U.S. PATENT DOCUMENTS

| | | |
|---|---|---|
| 6,413,811 B1 | 7/2002 | Masuoka |
| 2002/0195686 A1 | 12/2002 | Kim et al. |
| 2004/0178516 A1 | 9/2004 | Ogata |

(Continued)

FOREIGN PATENT DOCUMENTS

JP    2011192744 A    9/2011

*Primary Examiner* — Anthony Ho
*Assistant Examiner* — Kevin Quinto
(74) *Attorney, Agent, or Firm* — Slater Matsil, LLP

(57) ABSTRACT

A butted contact structure is provided. In one embodiment, a structure includes a first transistor on a substrate, the first transistor comprising a first source or drain region, a first gate, and a first gate spacer being disposed between the first gate and the first source or drain region. The structure includes a second transistor on the substrate, the second transistor comprising a second source or drain region, a second gate, and a second gate spacer being disposed between the second gate and the second source or drain region. The structure includes a butted contact disposed above and extending from the first source or drain region to at least one of the first or second gate, a portion of the first gate spacer extending a distance into the butted contact to separate a first bottom surface of the butted contact from a second bottom surface of the butted contact.

20 Claims, 20 Drawing Sheets

(56) References Cited

U.S. PATENT DOCUMENTS

| | | |
|---|---|---|
| 2007/0018254 A1 | 1/2007 | Yoo et al. |
| 2007/0034970 A1 | 2/2007 | Jin et al. |
| 2007/0063286 A1 | 3/2007 | Kotani |
| 2007/0085151 A1 | 4/2007 | Kotani |
| 2007/0096184 A1 | 5/2007 | Akamatsu |
| 2007/0096212 A1 | 5/2007 | Sato et al. |
| 2007/0210339 A1 | 9/2007 | Narasimhan et al. |
| 2008/0128825 A1* | 6/2008 | Sato ................ H01L 21/823835 257/369 |
| 2009/0108379 A1 | 4/2009 | Oosuka et al. |
| 2011/0294292 A1 | 12/2011 | Adetutu et al. |
| 2012/0187504 A1 | 7/2012 | Igarashi |
| 2016/0379925 A1 | 12/2016 | Ok et al. |
| 2018/0286957 A1 | 10/2018 | Bae et al. |

* cited by examiner

SHARED CONTACT STRUCTURE AND METHODS FOR FORMING THE SAME

PRIORITY

This application is a continuation of U.S. patent application Ser. No. 16/691,801, filed on Nov. 22, 2019, entitled "Shared Contact Structure and Methods for Forming the Same," now U.S. Pat. No. 10,755,978, which is a divisional of U.S. patent application Ser. No. 16/032,390, filed on Jul. 11, 2018, now U.S. Pat. No. 10,510,600, entitled "Shared Contact Structure and Methods for Forming the Same," each application is incorporated by reference herein in its entirety.

BACKGROUND

Contacts are typically vertical metal interconnect structures formed in an integrated circuit that connect various components (e.g., the active regions and gate electrodes) of a semiconductor device to a metal layer of interconnect. Individual semiconductor devices formed in a semiconductor substrate are electrically coupled to each other through contacts in order to form functional integrated circuits. As the semiconductor industry has progressed into nanometer technology process nodes, such as 5 nm nodes, in pursuit of higher device density, new challenges are presented. Therefore, there is a need for improved contact structures and methods.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
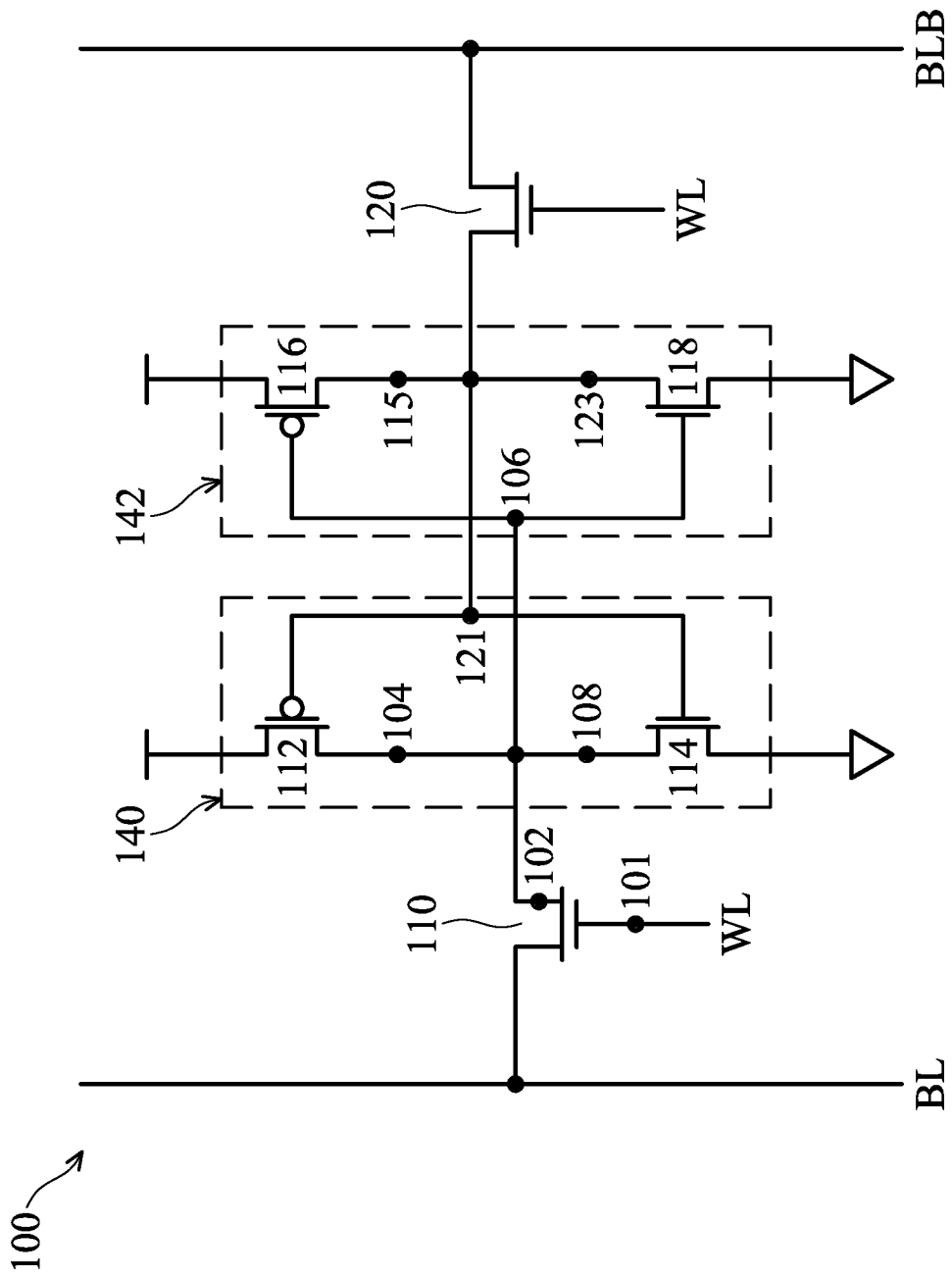
FIG. 1A depicts a schematic circuit diagram according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments described below provide methods for forming a shared contact structure that enables connection of a source or drain region of a transistor to a gate of the same or another transistor on a substrate without the use of a horizontal metal interconnect layer. A tapered gate spacer is disposed laterally between the source or drain region and the gate. The tapered gate spacer extends a distance into a bottom of the shared contact structure between interior angled sidewalls of the shared contact structure. The tapered gate spacer and angled sidewalls can ensure good metal-fill capability for the subsequent deposited metal fill without voids or seams. The shared contact structure can be formed by a double patterning process using two separate photomasks, each with a portion of a pattern corresponding to the shared contact structure.

The foregoing broadly outlines some aspects of embodiments described in this disclosure. It is contemplated that the concepts of the present disclosure may be implemented for a planar transistor device or for a three-dimensional transistor device, such as the semiconductor device 240 described in this disclosure. Some example devices for which aspects described herein may be implemented include fin field effect transistors (FinFETs), Horizontal Gate All Around (HGAA) FETs, Vertical Gate All Around (VGAA) FETs, nanowire channel FETs, strained-semiconductor devices, silicon-on-insulator (SOI) devices, or other devices that can be benefit from aspects of the present disclosure.

FIG. 1A depicts an example of a schematic circuit diagram of a 6T (6 transistors) static random access memory (SRAM) cell 100 according to some embodiments. The 6T SRAM cell 100 includes a first inverter 140 that is cross coupled with a second inverter 142. The first inverter 140 includes a pull-up transistor 112 and a pull-down transistor 114. The second inverter 142 includes a pull-up transistor 116 and a pull-down transistor 118. The SRAM cell 100 also includes pass gate transistors 110, 120. Gates (e.g., gate 101) of the pass gate transistors 110, 120 are coupled to and controlled by a word line WL, and source/drain of the pass gate transistors 110, 120 are coupled to a bit line BL and complementary bit line BLB, respectively.

Shared contacts or so-called butted contacts can be used on various connections in the circuit diagram shown in FIG. 1A. For example, the connection between the source/drain region 104 of the pull-up transistor 112 and gate 106 of the pull-up and pull-down transistors 116 and 118, and the connection between the source/drain region 115 of the pull-up transistor 116 and gate 121 of the pull-up and pull-down transistors 112 and 114. Other connections can be formed of butted contacts.

Figure 1B:
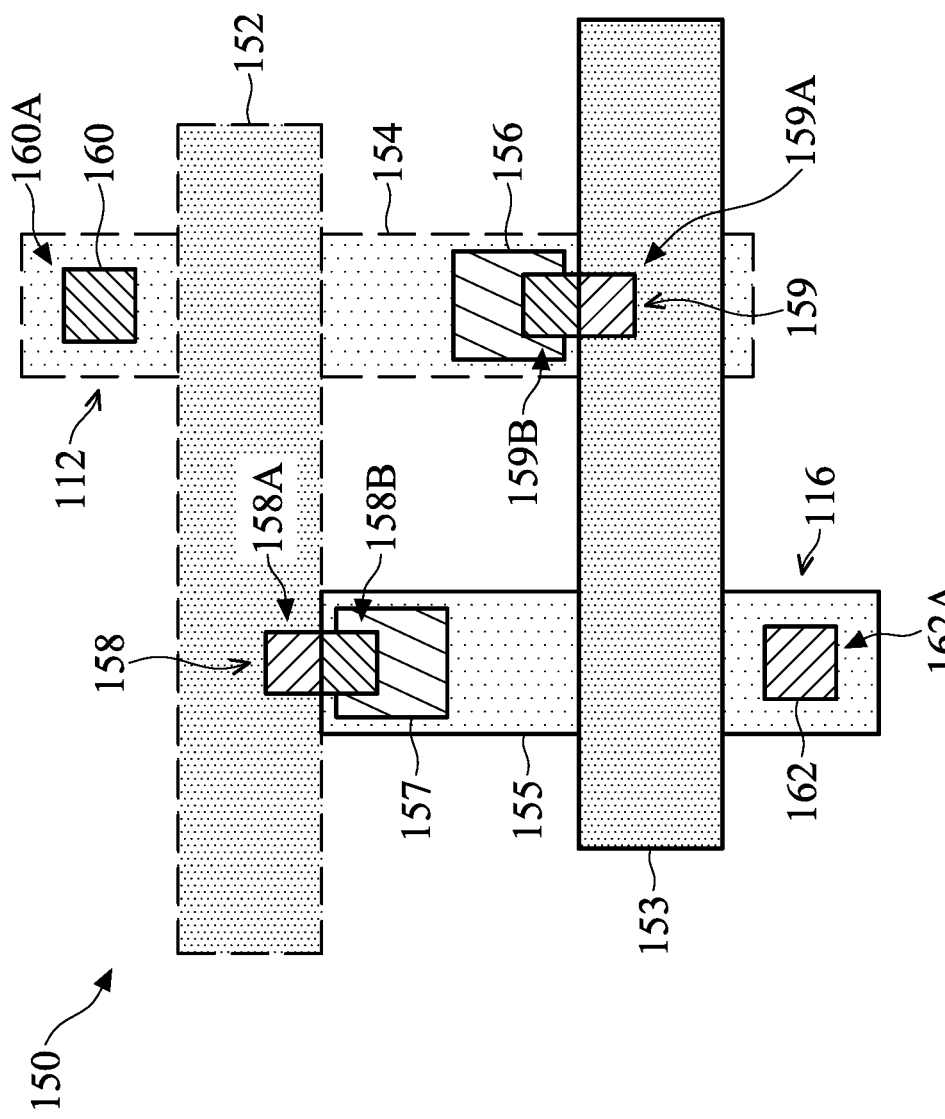
FIG. 1B depicts a top view of an IC layout corresponding to a portion of the circuit diagram shown in FIG. 1A.

FIG. 1B depicts a top view of an integrated circuit (IC) layout 150 corresponding to a portion of SRAM cell 100 shown in FIG. 1A. The IC layout 150 includes two pull-up transistors 112 and 116. For clarity, the pull-up transistor 112 is represented by features with a dotted line while the pull-up transistor 116 is represented by features with a solid line. The pull-up transistor 112 includes a gate 152 formed over a portion of an active region 154, while the pull-up transistor 116 includes a gate 153 formed over a portion of an active region 155. The gates 152 and 153 may include a metal-containing material, such as described below. Each pull-up transistor (112, 116) includes a drain region 156, 157 located within the active region 154 and 155, respectively. A butted contact 158, 159 may extend along a length from a first end to a second end. For example, the first end of the butted contact 158 may be in contact with the gate 152 that corresponds to the pull-up transistor 112 within a first inverter (e.g., the first inverter 140 of FIG. 1A). The second end of the butted contact 158 is in contact with the drain region 157 that corresponds to the pull-up transistor 116 within the second inverter (e.g., the second inverter 142 of FIG. 1A). Therefore, the butted contact connects the gate of transistors within one inverter to the source/drain of transistors within a cross-coupled inverter, as shown in the SRAM cell 100. The IC layout 150 also includes contacts 160 and 162. Contacts 160 and 162 can be any suitable interconnect or contact features desired in the semiconductor device 240. For example, contacts 160 and 162 may be disposed on the active regions 154, 155, respectively, and can be configured to provide a voltage Vcc to source terminals of the pull-up transistors 112 and 116, respectively.

It is contemplated that the transistors and the contact features depicted in FIG. 1B are for illustrative purposes and should not be considered as a limitation. The arrangement and/or the number of the transistors and contact features may vary depending upon the application. Other applications for shared or butted contacts include other memory applications, power devices, and any other semiconductors where adjacent components may be connected electrically at the transistor level. For example, while the present disclosure discusses a gate to drain butted contact, other butted contacts may be envisioned such as source to drain of adjacent transistors, gate to source of adjacent transistors, source to body, drain to body, and others.

Some embodiments use a multiple-patterning technology, for example, a double patterning process, to form butted contacts. For example, a rectangular-shape pattern corresponding to the butted contact (e.g., butted contact 158 of FIG. 1B) may be split or divided into two square-shape patterns 158A and 158B. The two square-shape patterns 158A, 158B are then recombined using two separate photomasks in successive lithography and etch steps to form a rectangular-shape butted contact 158 which is to be transferred to a layer of a device. Since the square-shape patterns 158A and 158B are transferred into the layer of the device by two separate lithography processes, proper critical dimension uniformity can be obtained. By breaking a layout into two different photomasks, a minimum line spacing in the combined pattern can be reduced while maintaining good resolution. In some embodiments, each photomask may also include patterns of the nominal contacts to be transferred to the substrate to ensure minimum number of the photomask involved. For example, the first photomask may include a square-shape pattern 158A of the butted contact 158, a square-shape pattern 159A of the butted contact 159, and a contact pattern 162A to be formed on the active region 155, while the second photomask may include a square-shape pattern 158B of the butted contact 158, a square-shape pattern 159B of the butted contact 159, and a contact pattern 160A to be formed on the active region 154. Various embodiments of forming the butted contacts will be discussed in more detail below.

Figure 2:
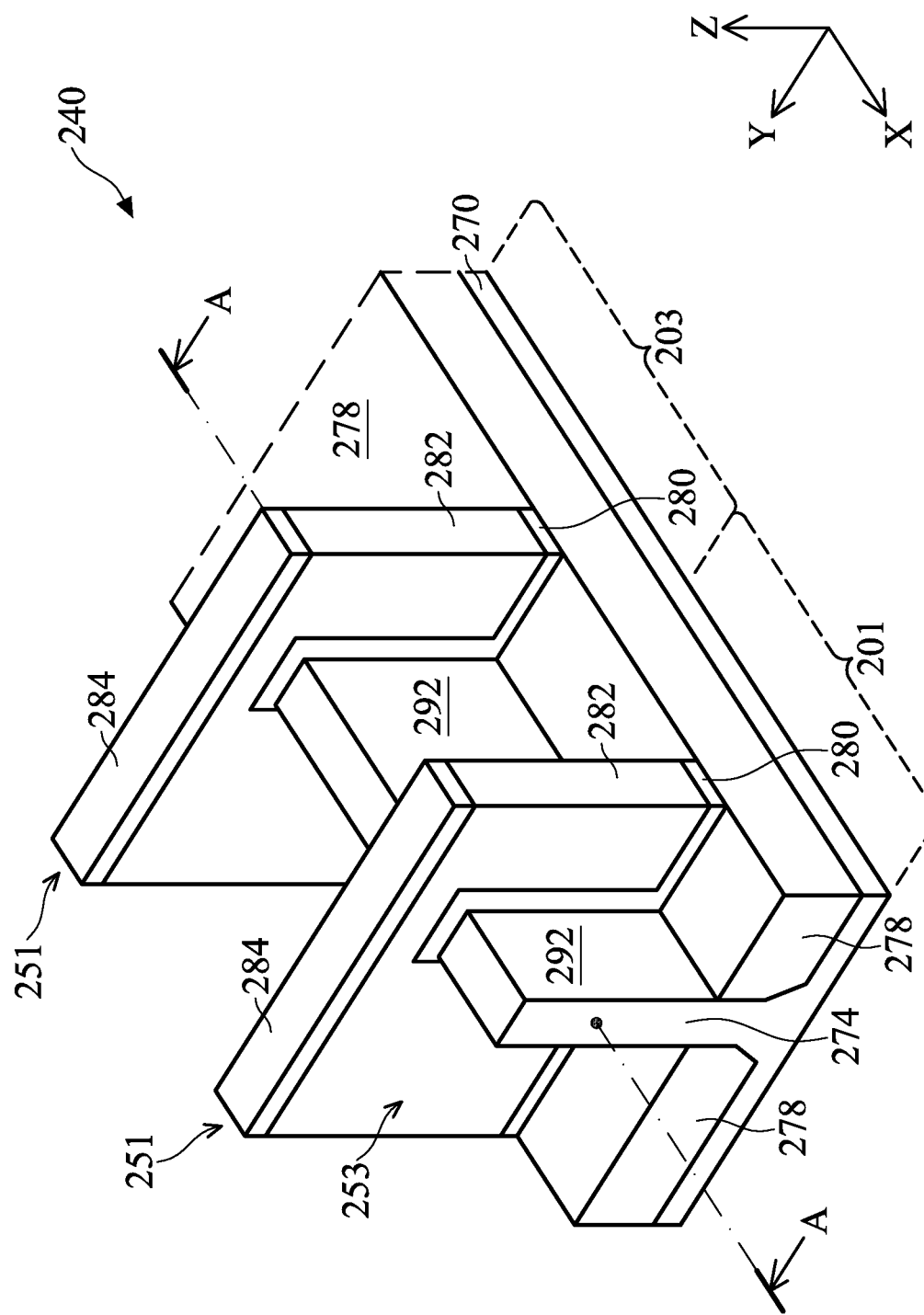
FIG. 2 depicts a semiconductor device that can be used in forming a portion of the circuit diagram of FIG. 1A according to some embodiments.

FIG. 2 depicts a semiconductor device 240 that can be used in forming a portion of the SRAM cell 100 of FIG. 1A, for example butted contacts which provide connections between gate 106 of the transistors 116 and 118 and a drain 104 of the transistor 112, or connections between gate 121 of the transistors 112, 114 and drain 115 of the transistor 116. The semiconductor device 240 has a fin 274 formed on a semiconductor substrate 270. The semiconductor substrate 270 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 270 may include an elemental semiconductor including silicon (Si) or germanium (Ge); a compound semiconductor; an alloy semiconductor; or a combination thereof. The fin 274 provides an active area of one or more of the transistors of the SRAM cell 100. The fin 274 is fabricated using suitable processes performed on the semiconductor substrate 270, including masking, photolithography, and/or etch processes, to form trenches 253 into the substrate 270, leaving the fin 274 extended upwardly from the substrate 270. The trenches 253 may then be filled with an insulating material such as an oxide (e.g., silicon oxide), a nitride, the like, or a combination thereof. The insulating material may be recessed, such as by using an acceptable etch process, to form the isolation regions 278. The insulating material is recessed such that the fin 274 protrudes above and from between neighboring isolation regions 278.

The semiconductor device 240 has gate structures 251 formed over top surface of the fin 274. As described herein, the gate structures 251 are dummy gate stacks in a replacement gate process, although other examples contemplate implementing a gate-first process. The gate structures 251 are over and extend perpendicularly to the fin 274. Each gate structure 251 includes an interfacial dielectric 280, a dummy gate 282 over the interfacial dielectric 280, and a mask 284 over the dummy gate 282, as shown in FIG. 2. The interfacial dielectrics 280, the dummy gates 282, and the masks 284 for the gate structures 251 may be formed by sequentially forming respective layers, and then patterning those layers into the gate structures 251. For example, the interfacial dielectrics 280 may include or be silicon oxide, silicon nitride, the like, or multilayers thereof. The dummy gates 282 may include or be silicon (e.g., polysilicon) or another material. The masks 284 may include or be silicon nitride, silicon oxynitride, silicon carbon nitride, the like, or a combination thereof. The layers can be formed or deposited by any suitable deposition technique. The layers for the interfacial dielectrics 280, the dummy gates 282, and the masks 284 may then be patterned, for example, using photolithography and one or more etch processes, to form the interfacial dielectrics 280, the dummy gates 282, and the masks 284 for each gate structure 251.

The semiconductor device 240 also includes source/drain regions 292 disposed in opposing regions of the fin 274 with respect to the gate structures 251. The source/drain regions 292 and one of the gate structures 251 (or the subsequently formed corresponding replacement gate structure) define at least a first transistor in a first transistor region 201. The expression "source/drain" described in this disclosure is intended to refer to a source or drain region of a transistor, for example the first transistor in the first transistor region 201. The first transistor in the first transistor region 201 can be, for example, a pull-up transistor, such as the pull-up transistor 112 of FIG. 1B. The other of the gate structures 251 (or the subsequently formed corresponding replacement gate structure) is a portion of a second transistor in a second transistor region 203, and the second transistor can be, for example, a pull-up transistor, such as the pull-up transistor 116 of FIG. 1B. FIG. 2 further illustrates a reference cross-section that is used in later figures. Cross-section A-A is in a plane along, e.g., channels in the fin 274 between opposing source/drain regions 292. Subsequent figures refer to this reference cross-section for clarity.

Figure 3:
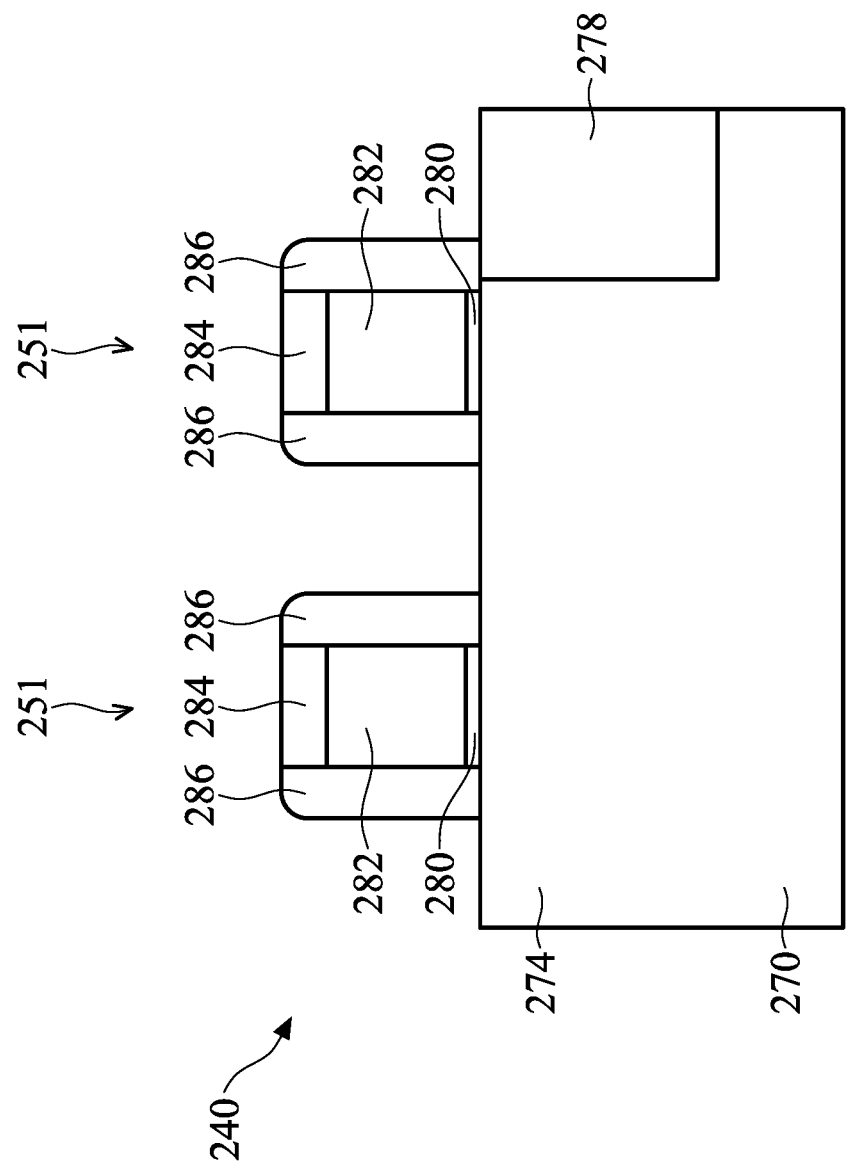
FIGS. 3 to 16, 17A, and 17B are schematic cross-sectional views of a portion of the semiconductor device corresponding to various stages of fabrication according to some embodiments.

FIG. 3 illustrates the formation of gate spacers 286 along sidewalls of the gate structures 251 (e.g., sidewalls of the interfacial dielectrics 280, dummy gates 282, and masks 284) and over the fin 274. The gate spacers 286 may be formed by conformally depositing one or more layers for the gate spacers 286 and anisotropically etching the one or more layers, for example. The one or more layers for the gate spacers 286 may include a material different from the material(s) for the gate structure 251. In some embodiments, the gate spacer 286 may include or be a dielectric material, such as silicon oxygen carbide, silicon nitride, silicon oxynitride, silicon carbon nitride, the like, multi-layers thereof, or a combination thereof, and may be deposited by any suitable deposition technique. An anisotropic etching process is then performed to remove portions of the spacer layers to form the gate spacers 286.

Figure 4:
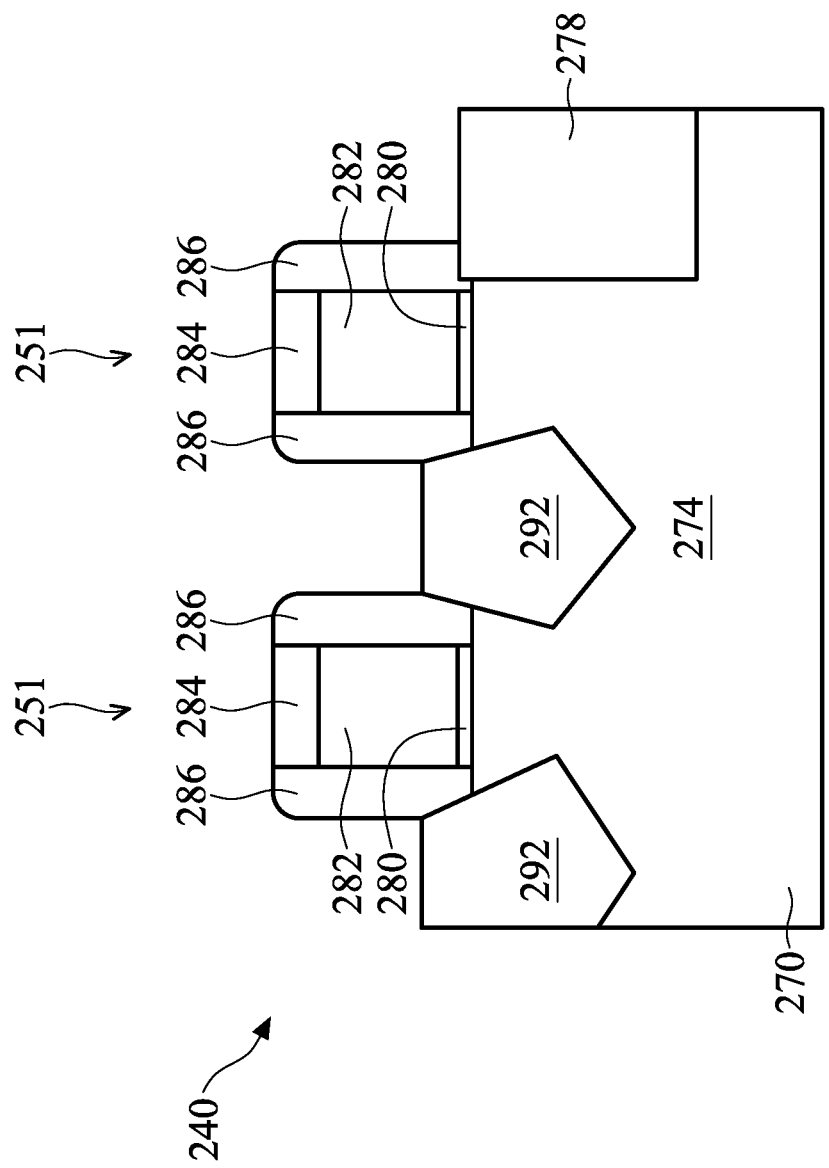

FIG. 4 illustrates the formation of epitaxial source/drain regions 292 in recesses in the fin 274. The recesses are then formed in the fin 274 on opposing sides of the gate structures 251. The recessing can be made by an etch process. The etch process can be isotropic or anisotropic, or further, may be selective with respect to one or more crystalline planes of the substrate 270. Hence, the recesses can have various cross-sectional profiles based on the etch process implemented.

Epitaxial source/drain regions 292 are epitaxially grown in the recesses. Depending on the conductivity type of the transistor, the material for the epitaxially source/drain regions 292 may be chosen to include or be silicon germanium, silicon carbide, silicon phosphorus, silicon carbon phosphorus, germanium, a III-V compound semiconductor, a II-VI compound semiconductor, or the like. The epitaxial source/drain regions 292 may be raised with respect to the fin 274 and may have facets, which may correspond to crystalline planes of the semiconductor substrate 270 and the orientation of the fin 274 relative to the crystalline plane of the substrate. In some examples, the epitaxial source/drain regions 292 may also be doped, such as by in situ doping during epitaxial growth and/or by implanting dopants into the epitaxial source/drain regions 28 after epitaxial growth.

Figure 5:
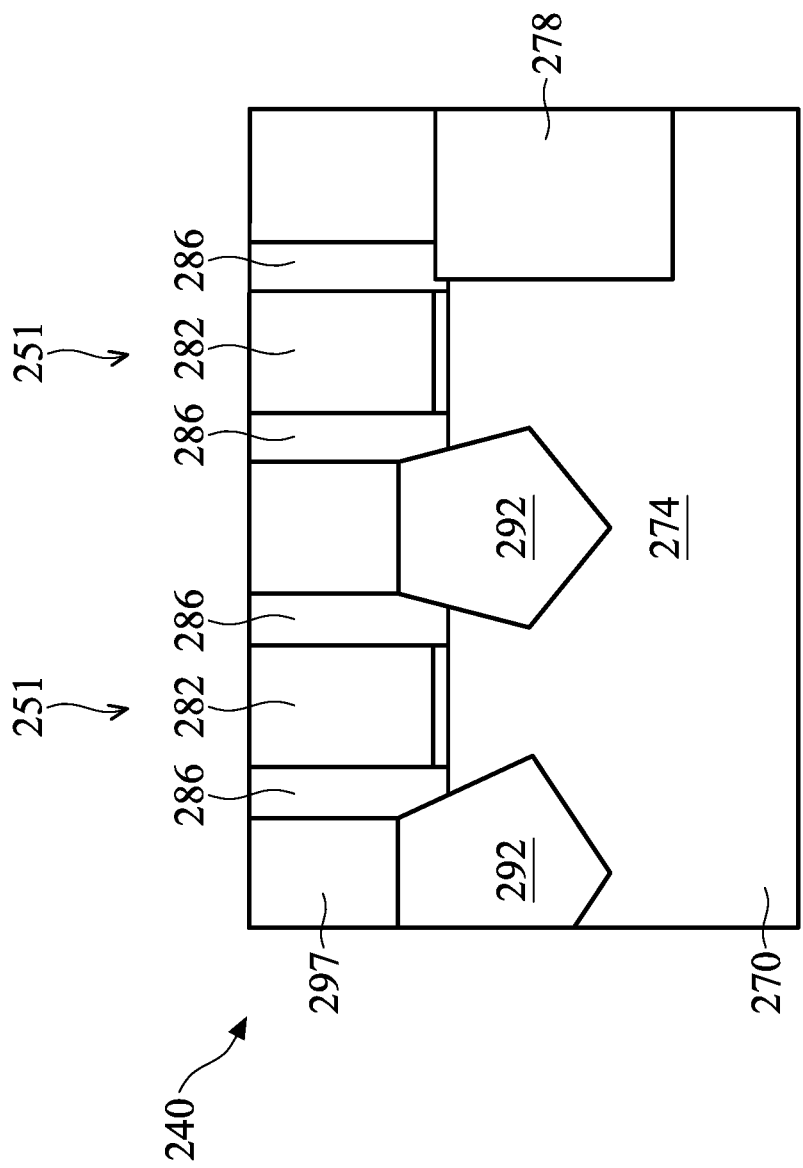

FIG. 5 illustrates the formation and subsequent planarization of a first interlayer dielectric (ILD) 297. The first ILD 297 is formed over the exposed surfaces of the source/drain regions 292, sidewalls and top surfaces of the gate spacers 286, top surfaces of the masks 284, and top surfaces of the isolation regions 278 using any suitable deposition technique. An optional contact etch stop layer (CESL) (not shown) may be deposited between the first ILD 297 and surfaces of the source/drain 292 and sidewalls of the gate spacers 286. The first ILD 297 may include or be tetraethylorthosilicate (TEOS) oxide, silicon dioxide, a low-k dielectric material (e.g., a material having a dielectric constant lower than silicon dioxide), or the like. The CESL may include or be silicon nitride, silicon carbon nitride, carbon nitride, the like, or a combination thereof. A planarization process, such as a chemical mechanical planarization (CMP), may then remove the first ILD 297 until top surfaces of the dummy gates 282 are exposed, which may also remove the masks 284.

Figure 6:
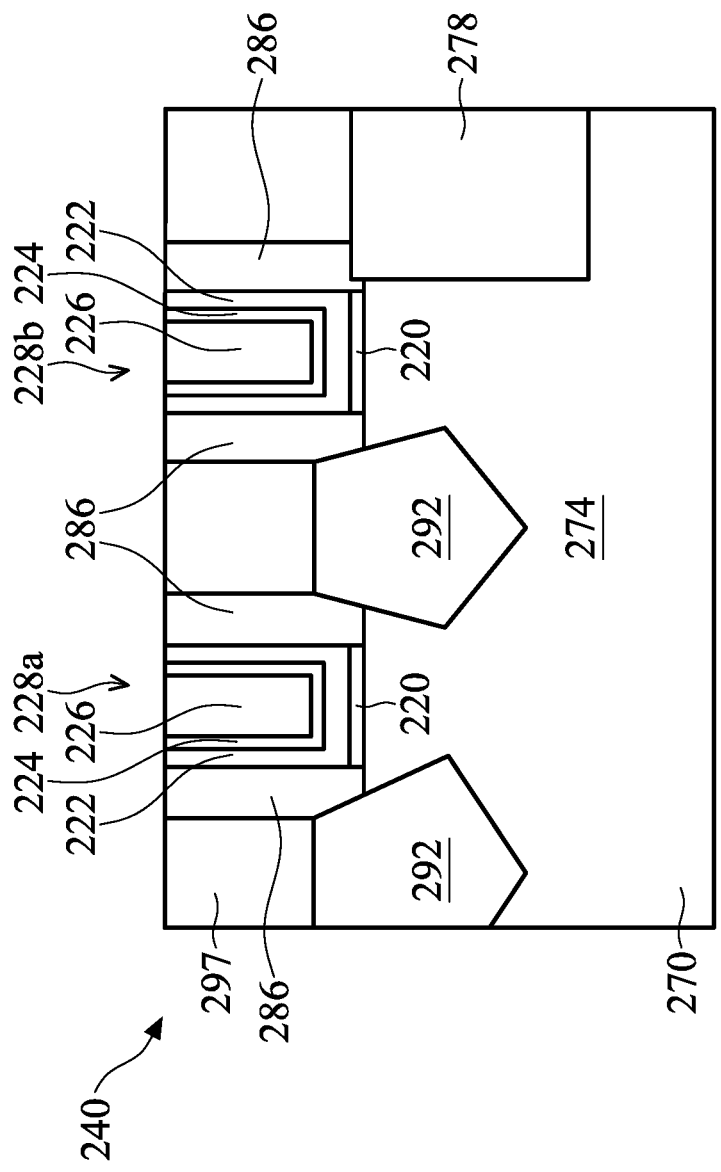

FIG. 6 illustrates the removal of the remaining gate structures 251 and the formation of replacement gate structures 228a, 228b. The gate structures 251 are removed using one or more etch processes. Upon removal of the gate structures 251, recesses are formed between the gate spacers 286 where the gate stacks are removed, and channel regions of the fin 274 are exposed through the recesses. The replacement gate structures 228a, 228b are then formed in the recesses where the gate structures 251 were removed. The replacement gate structures 228a, 228b each may include an interfacial dielectric 220, a gate dielectric layer 222, one or more optional conformal layers 224, and a gate conductive fill material 226. The replacement gate structures 228a, 228b may have a thickness in a range of about 8 nm to about 25 nm, for example about 12 nm to about 20 nm.

The interfacial dielectric 220 is formed on top surfaces of the fin 274 along the channel regions. The interfacial dielectric 220 can be an oxide (e.g., silicon oxide) formed by thermal or chemical oxidation of the fin 274.

The gate dielectric layer 222 can be conformally deposited in the recesses where gate stacks were removed (e.g., on the interfacial dielectric 220, and sidewalls of the gate spacers 286) and on the top surfaces of the first ILD 297 and gate spacers 286. The gate dielectric layer 222 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 224 can be conformally deposited on the gate dielectric layer 222. The one or more optional conformal layers 224 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer, and/or capping layer are selected so that a desired threshold voltage (Vt) is achieved for the transistor, which could be a p-type field effect transistor (pFET) or an n-type field effect transistor (nFET). The gate conductive fill material 226 is formed over the one or more conformal layers 224, if implemented, and/or the gate dielectric layer 222. The gate conductive fill material 226 can fill remaining recesses where the gate stacks were removed. The gate conductive fill material 226 may be or include a metal-containing material such as tungsten, cobalt, aluminum, ruthenium, copper, multi-layers thereof, a combination thereof, or the like.

A planarization process, like a CMP, may remove portions of the layer for the gate conductive fill material 226, one or more conformal layers 224, and gate dielectric layer 222 above the top surfaces of the first ILD 297 and gate spacers 286. The replacement gate structures 228a, 228b including the gate conductive fill material 226, one or more conformal layers 224, gate dielectric layer 222, and interfacial dielectric 220 may therefore be formed as illustrated in FIG. 6.

Figure 7:
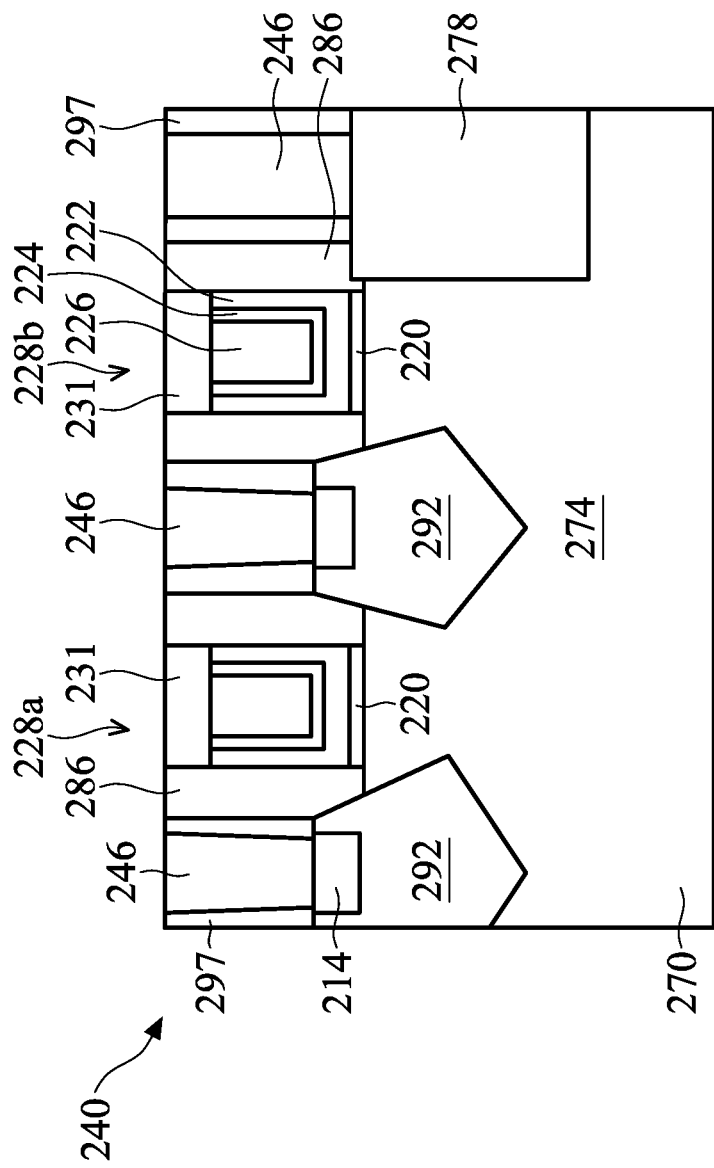

FIG. 7 illustrates the formation of a first self-aligned contact (SAC) 231 on each of the replacement gate structures 228a, 228b and the formation of conductive features to the epitaxial source/drain regions 292. After the formation of the replacement gate structures 228a, 228b, respective portions of the replacement gate structures 228a, 228b, such as the top portions of the gate dielectric layer 222, the one or more conformal layers 224, and the gate conductive fill material 226, are removed using one or more etch processes. Upon removal of the top portion of the replacement gate structures 228a, 228b, recesses are formed between the gate spacers 286. Respective first SACs 231 are then formed in the recesses where the top portions of the gate dielectric layer 222, the one or more conformal layers 224, and the gate conductive fill material 226 were removed. The first SAC 231 protects the replacement gate structures 228a, 228b during subsequent formation of openings, which are configured to respectively accommodate subsequent butted contacts for electrically connecting to the source/drain regions 292. The first SAC 231 may include or be an insulating material, such as silicon oxide, silicon nitride, silicon oxynitride, silicon carbon oxynitride, silicon carbon nitride, any suitable dielectric material, or any combination thereof. In some embodiments, the first SAC 231 is silicon carbon oxynitride. The first SAC 231 may be formed by a CVD, PVD, ALD, any suitable deposition technique, or a combination thereof, and subsequent planarization, such as a CMP.

After the first SACs 231 are formed, source/drain contact openings are formed through the first ILD 297 to the source/drain regions 292 to expose at least portions of the source/drain regions 292. Conductive features are then formed in the source/drain contact openings. The conductive features may include a silicide region 214 formed on the source/drain regions 292 and a conductive material 246 formed over the silicide region 214. The first ILD 297 may be patterned with the openings, for example, using photolithography and one or more etch processes, such as a dry etch or any suitable anisotropic etch process. While not shown, each conductive material 246 may include, for example, an adhesion layer conformally deposited in the source/drain contact openings and over the first ILD 297, a barrier layer conformally deposited on the adhesion layer, and a conductive fill material deposited on the barrier layer. The silicide region 214 may be formed by thermally reacting an upper portion of the source/drain regions 292 with the adhesion layer, which can be titanium, tantalum, or the like. The barrier layer may be or include titanium nitride, titanium oxide, tantalum nitride, tantalum oxide, any suitable transition metal nitrides or oxides, the like, or any combination thereof. The conductive fill material may be or include cobalt, tungsten, copper, ruthenium, aluminum, gold, silver, alloys thereof, the like, or a combination thereof. After the conductive fill material is deposited, excess conductive fill material, barrier layer, and adhesion layer may be removed by using a planarization process, such as a CMP, for example. Hence, top surfaces of the conductive material 246 and the first ILD 297 may be coplanar.

Figure 8:
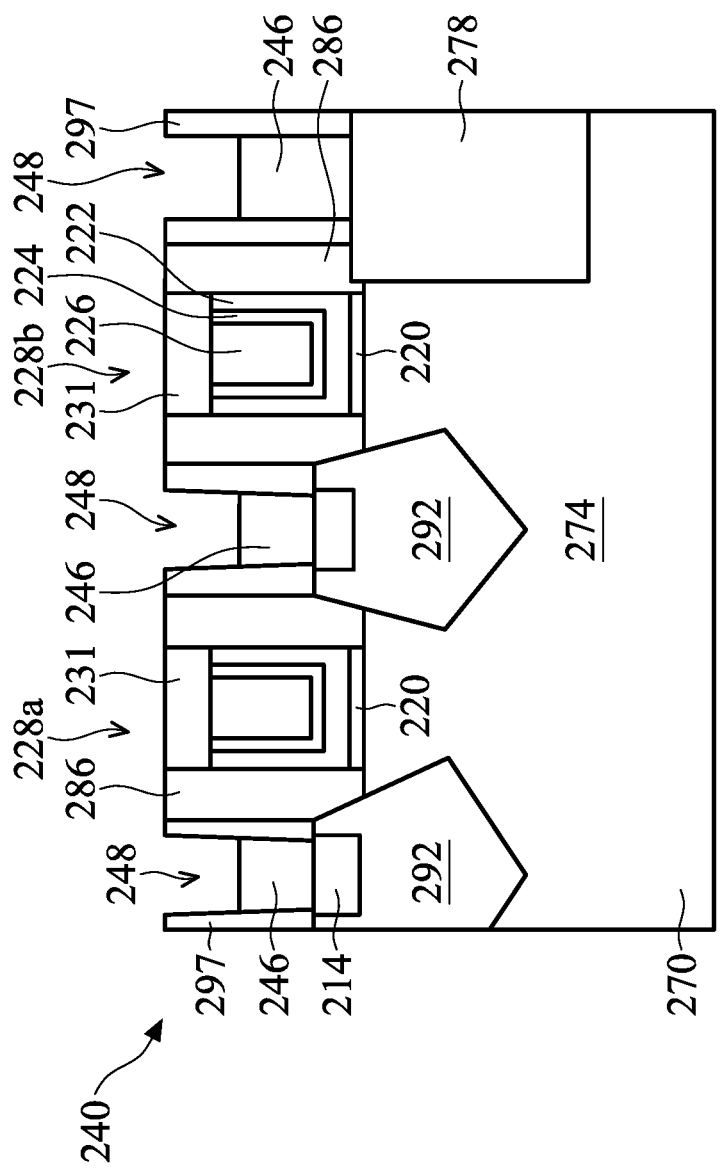

FIG. 8 illustrates etching back the conductive material 246 to thereby form recesses 248. The etch back can include using one or more etch processes selective to the conductive material 246. The recesses 248 are formed so that the top surface of the conductive material 246 is lower than the top surfaces of the first ILD 297, the first SAC 231 and the gate spacers 286.

Figure 9:
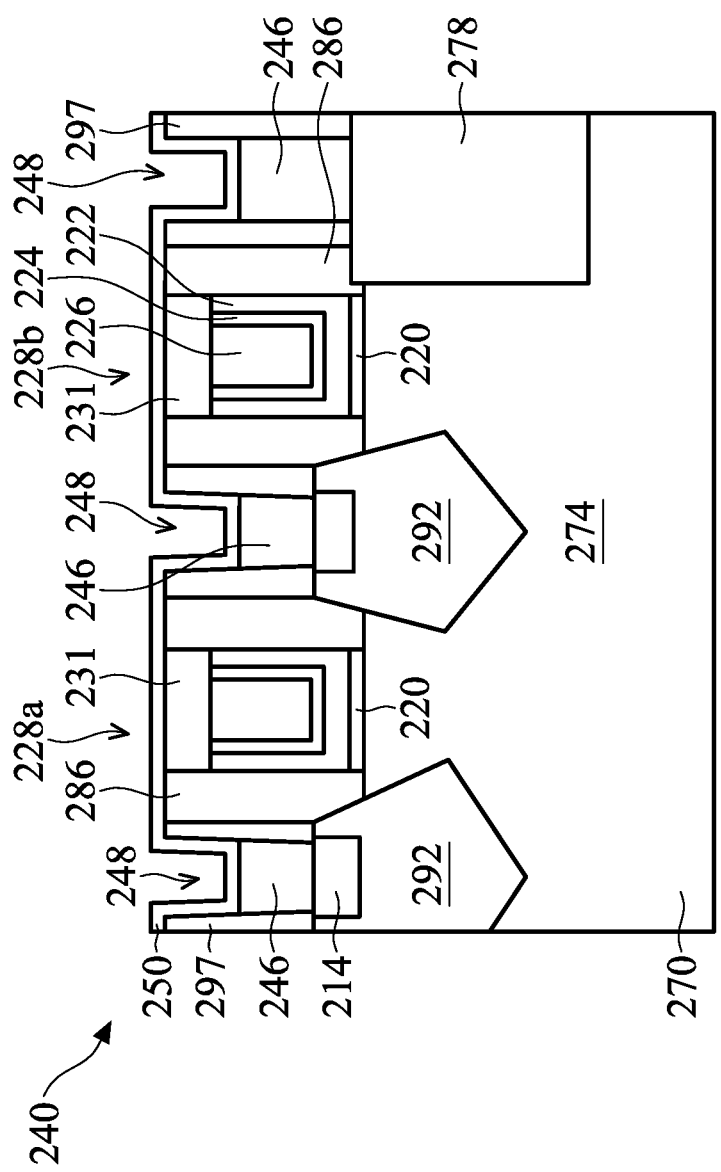

FIG. 9 illustrates forming a protective liner 250. After the recesses 248 are formed, the protective liner 250 is conformally deposited in the recesses 248 (e.g., on the exposed surfaces of the first ILD 297 and the conductive material 246) and on the top surfaces of the first ILD 297, the first SAC 231, and the gate spacers 286. The protective liner 250 may prevent damage to underlying device features during etching of contact openings. In some embodiments, the protective liner 250 may be formed of a material having a relatively high etch selectivity compared to the gate spacers 286. For example, the protective liner 250 may be a dielectric which may include or be aluminum oxide ($AlO_x$), aluminum oxynitride (AlON), aluminum nitride (AlN), titanium oxide ($TiO_x$), titanium oxynitride (TiON), titanium nitride (TiN), and the like. In an example, the protective liner 250 is AlON. The protective liner 250 may be deposited by ALD, PVD, CVD, or any suitable deposition technique.

Figure 10:
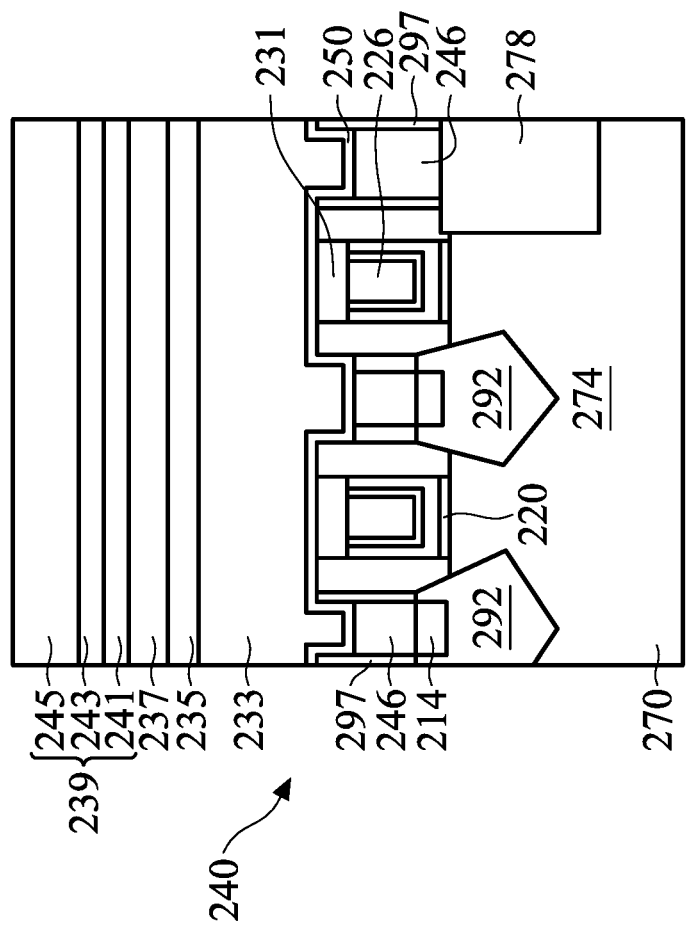

FIG. 10 illustrates forming a second SAC 233. After the protective liner 250 is formed, the second SAC 233 is formed over the protective liner 250. The second SAC 233 may be formed of a material different from the first SAC 231. The second SAC 233 may be made of an insulating material, such as silicon oxide, silicon nitride, silicon oxynitride, silicon carbon oxynitride, silicon carbon nitride, any suitable dielectric material or any combination thereof. In some embodiments, the second SAC 233 is silicon nitride. The second SAC 233 may be formed by a CVD, PVD, any suitable deposition technique, or a combination thereof. If desired, a planarization process, like a CMP, may be used to planarize the top surface of the second SAC 233.

FIG. 10 further illustrates the formation of a first hard mask layer 235, a second hard mask layer 237, and a tri-layer mask structure 239 sequentially over the second SAC 233. The first hard mask layer 235 and the second hard mask layer 237 are configured to provide etching selectivity relative to the second SAC 233 and the first hard mask layer 235, respectively, during one or more etch processes. The first hard mask layer 235 may be made of a metal compound, such as titanium nitride (TiN), tungsten carbide (WC), tantalum nitride (TaN), tungsten nitride (WN), or another material. The second hard mask layer 237 may include or be a silicon oxide layer or any suitable oxide materials. The first hard mask layer 235 and second hard mask layer 237 may be deposited by any suitable deposition technique, such as PVD, CVD, or the like. The tri-layer mask structure 239 includes a bottom layer 241, a middle layer 243, and a top layer 245. The tri-layer structure 239 may be selected to be suitable for a deep ultraviolet (DUV) or an extreme ultraviolet (EUV) photolithography. The bottom layer 241 may be a bottom anti-reflective coating (BARC) layer, such as silicon rich oxide or silicon oxycarbide (SiOC). The middle layer 243 may be a silicon-containing or metal-containing polymer. The top layer 245 may be a radiation sensitive layer, such as a photoresist. The bottom layer 241, middle layer 243, and top layer 245 may be deposited by any suitable deposition technique, such as PVD, CVD, spin-on coating, or the like.

Figure 11:
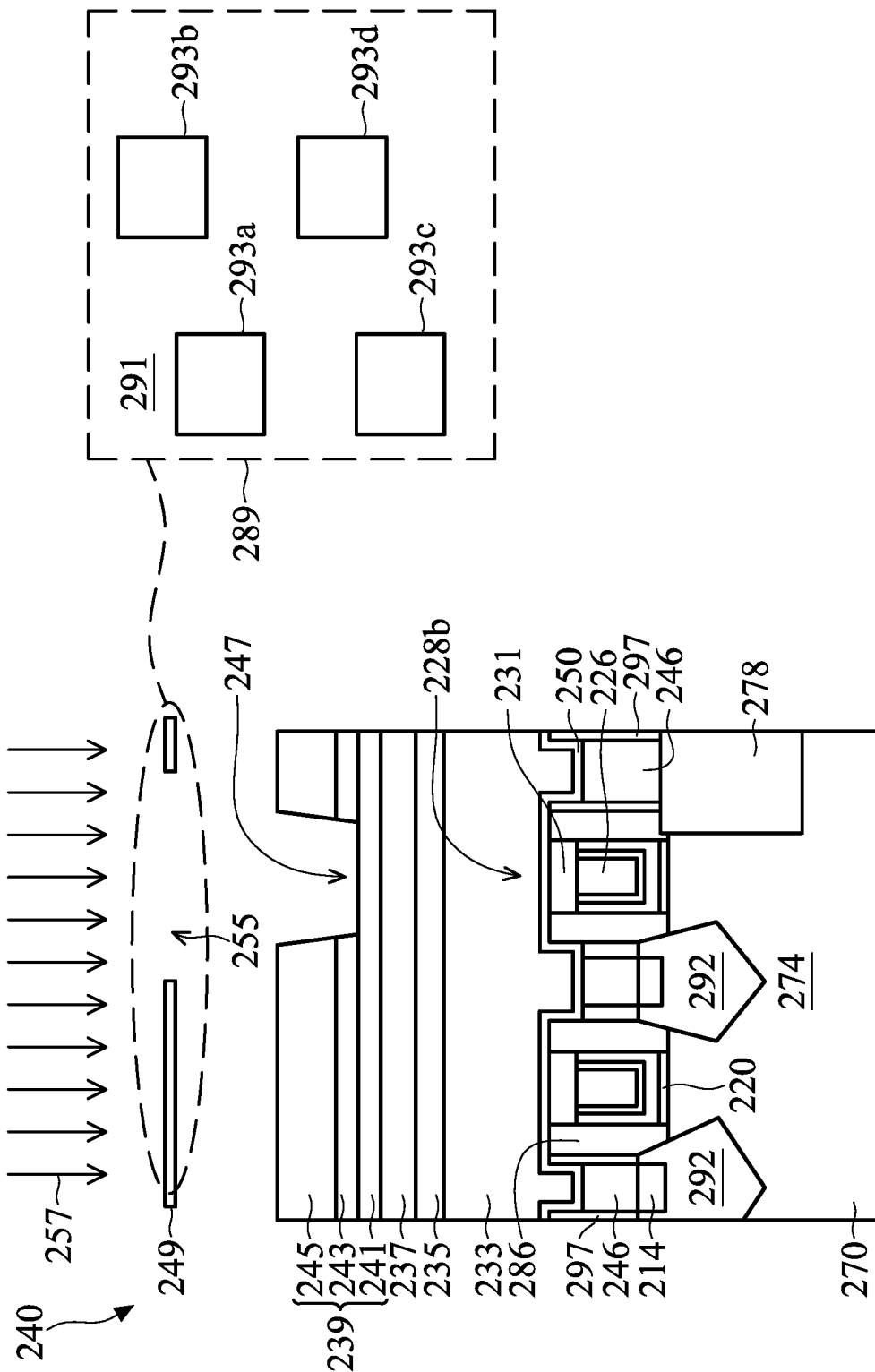

FIG. 11 illustrates the formation of a first opening 247 through the top layer 245 and middle layer 243 of the tri-layer mask structure 239 during a first photolithography and etch process. The first opening 247 formed in the top layer 245 is generally aligned with the replacement gate 228b. The first photolithography process is performed by positioning a first photomask 249 over the structure of FIG. 10. The first photomask 249 may be suitable for exposure with DUV radiation such as ArF excimer laser (193 nm) or KrF excimer laser (248 nm). The first photomask 249 has a first pattern 255 which can be various features such as squares, lines, holes, grids, or any desired shape such as polygons, depending on the features to be formed in a target layer. In some embodiments, the first pattern 255 contains a square pattern.

Inset 289 in FIG. 11 is an enlarged top view of a portion of a pattern 291 of the first photomask 249 used to pattern the top layer 245 according to some embodiments. The pattern 291 includes a plurality of features 293a, 293b, 293c, 293d, which can be lines, squares, grids, or any desired shape such as polygons, depending on the features to be formed in the top layer 245. In some embodiments, the features 293a, 293b, 293c, 293d are a square-shape pattern. It is contemplated that four features and their arrangement are shown for illustrative purposes. The features 293a, 293b, 293c, 293d can be repetitive on the first photomask 249, depending on the application and the features to be formed in the semiconductor device 240. The features 293a, 293b, 293c, 293d may be to provide openings for contacts that provide electrical connection to source/drain regions and/or gate for the semiconductor device 240. For example, the feature 293a may be a square-shape pattern corresponding to a portion of a first butted contact (e.g., the pattern 158A of the butted contact 158, as shown in FIG. 1B). The feature 293b may be a square-shape pattern corresponding to a portion of a second butted contact (e.g., the pattern 159A of the butted contact 159, as shown in FIG. 1B). The features 293c, 293d may be a square-shape pattern corresponding to contact features (e.g., the contact patterns 162A as shown in FIG. 1B). The features 293a, 293b of the first photomask 249 and features 279a, 279b from a second photomask 269 (to be discussed below in FIG. 14) are recombined to produce a rectangular-shape butted contact (e.g., butted contacts 158, 159 as shown in FIG. 1B) which is to be transferred to a target layer (e.g., the second SAC 233). Depending on the application, the features 293a, 293b, 293c, 293d may have a dimension in a range between about 10 nm and about 80 nm, for example about 20 nm to about 55 nm.

The first pattern 255 is transferred to the top layer 245 by exposing the top layer 245 to a radiation beam 257 using the first photomask 249. The radiation beam 257 may be a EUV radiation (e.g., 13.5 nm) or a DUV radiation such as ArF excimer laser (193 nm) or KrF excimer laser (248 nm). Depending on the mask material, other suitable radiations, such as an e-beam, an x-ray, or an ion beam, may also be used. Exposed or unexposed portions of the top layer 245 may then be removed depending on whether a positive or negative resist is used.

The middle layer 243 is then patterned using the patterned top layer 245 as a mask. As a result, the first opening 247 of the top layer 245 is transferred to the middle layer 243. The middle layer 243 may be patterned using any suitable process, such as a dry etch process. Example dry etch process may be performed in a dual RF power source plasma reactor using a chemistry containing an inert gas, such as argon, and a fluorocarbon gas such as tetrafluoromethane ($CF_4$), trifluoromethane ($CHF_3$), hexafluorobutadiene ($C_4F_8$), difluoromethane ($CH_2F_2$), octofluoropropane ($C_3F_8$), octofluorocyclobutane ($C_4F_8$), or any combinations thereof. In some embodiments, the chemistry includes $CF_4$ and $CHF_3$. The plasma reactor may be maintained at a chamber pressure of about 5 mTorr to about 20 mTorr, for example about 10 mTorr. During the dry etch process, the source power is provided at a first power level and the bias power is provided at a second power level, and a ratio of the first power level to the second power level may be controlled in a range between about 30:1 and about 10:1, for example about 20:1. In some embodiments, the first power is about 300 W and the second power is about 15 W, for example.

Figure 12:
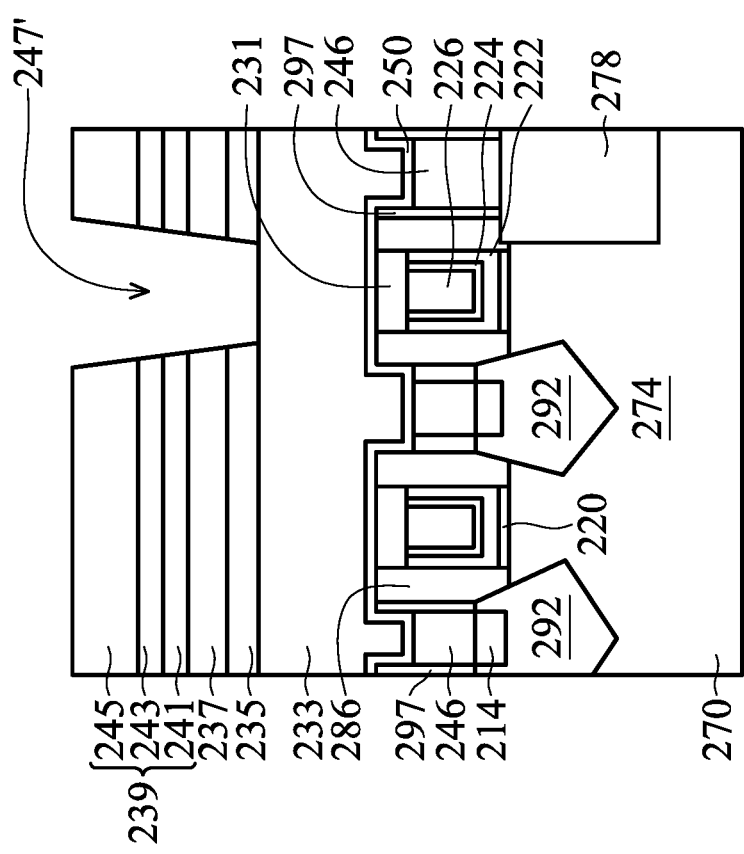

FIG. 12 illustrates the formation of the first opening 247 through the bottom layer 241 and the underlying hard mask layers 235 and 237. The bottom layer 241 is patterned using the patterned top and middle layers 245, 243 as a mask. The bottom layer 241 may be patterned using any suitable process, such as a dry etch process. The dry etch process may be performed in the dual RF power source plasma reactor. Example dry etch process for etching the bottom layer 241 may include a first etch process and a second etch process following the first etch process. Due to the shrunken device feature sizes, the margin for a misalignment between the contact openings and the gate electrode is significantly reduced in advanced technology. A reduced margin for misalignment may cause substantial device yield loss or create serious device reliability concerns, especially in a butted contact area, where a misalignment may easily cause a complete disconnection to a source/drain region or a gate electrode. Therefore, it may be advantageous to form the first opening 247 with a wider diameter for ease of lithography process, and then tailor/decrease the diameter of the opening when transferring through the tri-layer structure 239. The two-stage etch process allows gradual reduction of the pattern critical dimension in the bottom layer 241. The reduced pattern critical dimension can avoid the chances of misalignment between the contact opening and the gate electrode.

In some embodiments, the first etch process uses a first chemistry containing $N_2$ and $H_2$. The $N_2$ is flowed into the plasma reactor at a first volumetric flowrate, and the $H_2$ is flowed into the plasma reactor at a second volumetric flowrate, and a ratio of the first volumetric flowrate to the second volumetric flowrate can be controlled in a range from about 2:1 and about 5:1, for example about 3:1. The plasma reactor may be maintained at a chamber pressure of about 1 mTorr to about 30 mTorr, for example about 10 mTorr. During the first etch process, the source power is provided at a first power level and the bias power is provided at a second power level, and a ratio of the first power level to the second power level may be controlled in a range between about 3:1 and about 7:1, for example about 5:1. In some embodiments, the first power is about 500 W and the second power is about 100 W, for example.

After the first etch process, the second etch process is performed in the same plasma reactor using a second chemistry containing carbon dioxide ($CO_2$) and oxygen ($O_2$). The $CO_2$ is flowed into the plasma reactor at a first volumetric flowrate, and the $O_2$ is flowed into the plasma reactor at a second volumetric flowrate, and a ratio of the first volumetric flowrate to the second volumetric flowrate can be controlled in a range from about 2:1 and about 6:1, for example about 3:1. The plasma reactor may be maintained at a chamber pressure of about 1 mTorr to about 30 mTorr, for example about 10 mTorr. During the second etch process, the source power is provided at a first power level and the bias power is provided at a second power level, and a ratio of the first power level to the second power level may be controlled in a range between about 2:1 and about 6:1, for example about 4:1. In some embodiments, the first power is about 200 W and the second power is about 50 W, for example. Upon completion of the second etch process, the opening of the top layer 245 may have a first diameter and the opening of the bottom layer 241 may have a second diameter relatively smaller than the first diameter.

The second hard mask layer 237 is then patterned using the patterned tri-layer structure 239 as a mask. The second hard mask layer 237 may be patterned using any suitable process, such as a dry etch process. The dry etch process may be performed in the dual RF power source plasma reactor. Example dry etch process for etching the second hard mask layer 237 may include using a chemistry containing an inert gas, such as argon, and a fluorocarbon gas such as $CF_4$, $CHF_3$, $C_4F_6$, hexafluoroethane ($C_2F_6$), difluoromethane ($CH_2F_2$), octofluoropropane ($C_3F_8$), octofluorocyclobutane ($C_4F_8$), or any combination thereof. In some embodiments, the chemistry includes $CF_4$ and argon. The plasma reactor may be maintained at a chamber pressure of about 5 mTorr to about 20 mTorr, for example about 10 mTorr. During the dry etch process, the source power is provided at a first power level and the bias power is provided at a second power level, and a ratio of the first power level to the second power level may be controlled in a range between about 2:1 and about 6:1, for example about 3.5:1. In some embodiments, the first power is about 500 W and the second power is about 150 W, for example.

Thereafter, a dry etching process and/or a strip process, such as an ashing process, may be performed to sequentially remove the patterned top layer 245, the patterned middle layer 243, and the patterned bottom layer 241. A wet cleaning process may be performed following the strip process.

An etch process is then performed to transfer the first opening 247 from the second hard mask 237 to the first hard mask layer 235. The etch process may be a dry etch process performed in the dual RF power source plasma reactor. Example dry etch process for etching the first hard mask layer 235 may include using a chemistry containing an inert gas, such as argon, and a fluorocarbon gas such as $CF_4$, $CHF_3$, $C_4F_6$, hexafluoroethane ($C_2F_6$), difluoromethane ($CH_2F_2$), octofluoropropane ($C_3F_8$), octofluorocyclobutane ($C_4F_8$), or any combination thereof. In some embodiments, the chemistry includes $C_4F_8$ and argon. The plasma reactor may be maintained at a chamber pressure of about 5 mTorr to about 20 mTorr, for example about 10 mTorr. During the dry etch process, the source power is provided at a first power level and the bias power is provided at a second power level, and a ratio of the first power level to the second power level may be controlled in a range between about 2:1 and about 6:1, for example about 4:1. In some embodiments, the first power is about 200 W and the second power is about 50 W, for example. A wet cleaning process may be performed following the dry etch process to remove residues.

Figure 13:
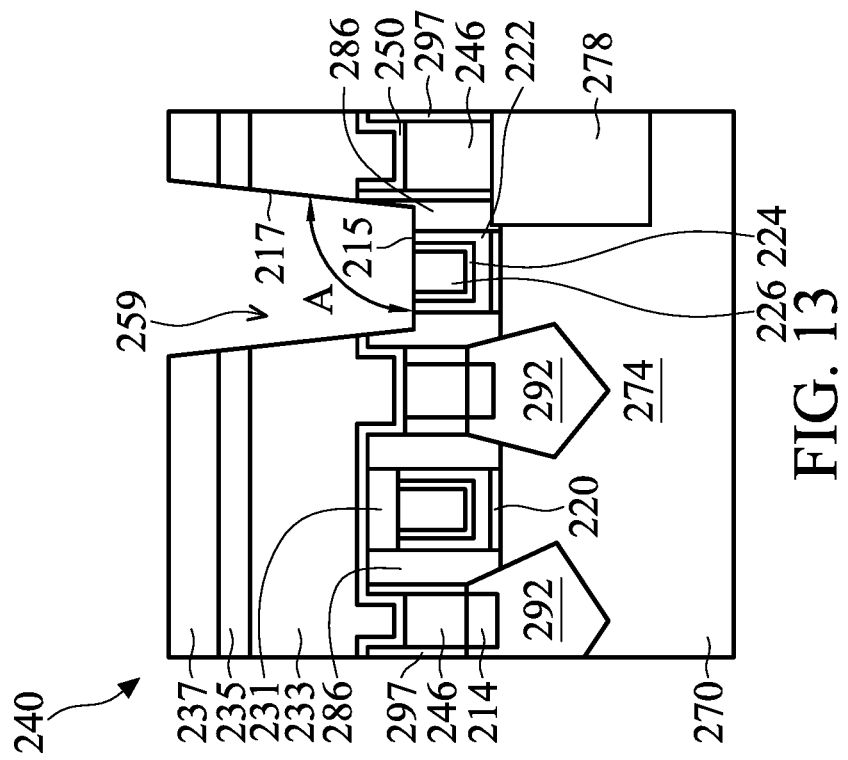

FIG. 13 illustrate the formation of a first contact opening 259 through portions of the second SAC 233, the protective liner 250, the first SAC 231, and the gate spacers 286, using the patterned second hard mask 237 and the patterned first hard mask layer 235 as a mask. The first contact opening 259 can be formed by using one or more etch processes. Example etch processes may include a first dry etch process performed in the dual RF power source plasma reactor to remove a portion of the second SAC 233 using the patterned second hard mask 237 and the patterned first hard mask layer 235 as a mask. The first dry etch process may use a chemistry including a fluorine-containing gas and an inert gas such as argon. Suitable fluorine-containing gas may include, but is not limited to $CF_4$, $CHF_3$, $CH_3F$, $C_4F_6$, $C_2F_6$, $CH_2F_2$, $C_4F_8$, or any combination thereof. In some embodiments, the chemistry includes $C_4F_8$ and $CH_3F$. The fluorine-containing gas is flowed into the plasma reactor at a first volumetric flowrate, and the argon is flowed into the plasma reactor at a second volumetric flowrate, and a ratio of the first volumetric flowrate to the second volumetric flowrate can be controlled in a range from about 1:1 and about 3:1, for example about 2:1. The plasma reactor may be maintained at a chamber pressure of about 5 mTorr to about 200 mTorr, for example about 10 to 50 mTorr. During the dry etch process, the source power is provided at a first power level and the bias power is provided at a second power level, and a ratio of the first power level to the second power level may be controlled in a range between about 1:1 and about 2:1. In some embodiments, the first power is about 300 to 500 W and the second power is about 100 W, for example.

Upon removal of the second SAC 233, a portion of the protective liner 250 is exposed. A second dry etch process may then be performed in the dual RF power source plasma reactor to remove the exposed protective liner 250, using the patterned second hard mask 237 and the patterned first hard mask layer 235 as a mask. The second dry etch process may use a chemistry including a chlorine-containing gas and an inert gas such as helium or argon. Suitable chlorine-containing gas may include, but is not limited to chlorine ($Cl_2$) and boron trichloride ($BCl_3$), methyl fluoride ($CH_3F$), and the like. The plasma reactor may be maintained at a chamber pressure of about 10 mTorr to about 300 mTorr, for example about 100 mTorr. During the second dry etch process, the source power is provided at a first power level and the bias power is provided at a second power level, and a ratio of the first power level to the second power level may be controlled in a range between about 3:1 and about 6:1, for example about 5:1. In some embodiments, the first power is about 800 W and the second power is about 150 W, for example.

Upon removal of the protective liner 250, a portion of the first SAC 231 and a portion of the gate spacers 286 are exposed. A third dry etch process may be performed in the dual RF power source plasma reactor to remove the exposed first SAC 231, using the patterned second hard mask 237 and the patterned first hard mask layer 235 as a mask. In some cases, removing the exposed first SAC 231 may be performed using the gate spacers 286 as a mask. In any case, top surfaces of the gate spacers 286, the gate dielectric layer 222, the one or more optional conformal layers 224, and the gate conductive fill material 226 are exposed as a result of the third dry etch process. The third dry etch process may use a chemistry including a fluorine-containing gas and a hydrogen-containing gas. Suitable fluorine-containing gas may include, but is not limited to $F_2$, $CF_4$, $CHF_3$, $C_4F_6$, $C_2F_6$, $CH_2F_2$, $C_4F_8$, $SF_6$, or any combination thereof. Suitable hydrogen-containing gas may include, but is not limited to $CH_4$, $H_2$, $NH_3$, a hydrocarbon or any molecule with an abstractable hydrogen atom, or any combination thereof. The chemistry may further include an oxygen-containing gas, such as $O_2$, NO, $N_2O$ etc. In some embodiments, the chemistry includes $CF_4$ and $CH_4$. The plasma reactor may be maintained at a chamber pressure of about 5 mTorr to about 200 mTorr, for example about 50 mTorr. During the dry etch process, the source power is provided at a first power level and the bias power is provided at a second power level, and a ratio of the first power level to the second power level may be controlled in a range between about 2:1 and about 6:1, for example about 4:1. In some embodiments, the first power is about 1600 W and the second power is about 350 W, for example.

The first contact opening 259 has a bottom 215 and a sidewall 217 extending upwardly from the bottom 215. The bottom 215 can be substantially co-planar with the top surfaces of the gate conductive fill material 226, the gate dielectric layer 222, and one or more optional conformal layers 224. In some embodiments, the bottom 215 may further extend into a portion of the gate spacers 286. The sidewall 217 may be at an angle "A" with respect to the bottom 215. In some embodiments, the angle "A" is in a range between 91° to about 100°, such as about 92° to about 95°, for example about 93° to about 94°. The angle "A" may vary depending upon the application and/or the parameters used by the etch process(es) during the formation of the first contact opening 259.

Figure 14:
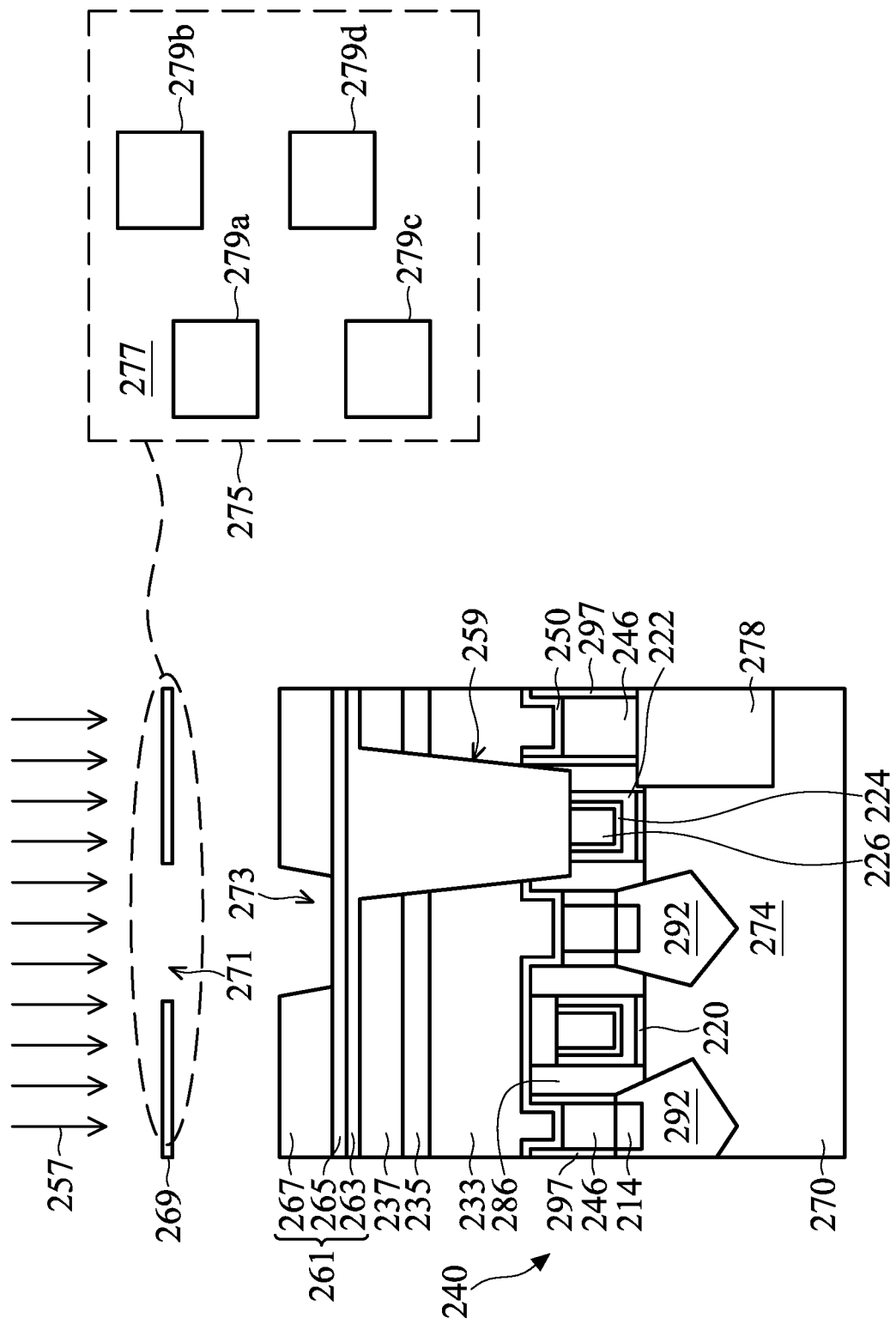

FIG. 14 illustrates the formation of a tri-layer structure 261 over the structure of FIG. 13. The tri-layer structure 261, which can implement the same or similar materials using the same or similar processes as the tri-layer structure 239, includes a bottom layer 263, a middle layer 265, and a top layer 267. The first contact opening 259 is filled and overburdened by the bottom layer 263 to a predetermined thickness. In an example, the top surface of the bottom layer 263 is higher than the top surface of the second hard mask layer 237. The middle layer 265 and the top layer 267 are then sequentially deposited over the bottom layer 263.

After the tri-layer structure 261 is formed, the top layer 267 is patterned using a second photolithography process. The second photolithography process is performed by positioning a second photomask 269 over the semiconductor device 240. The second photomask 269 has a second pattern 271. The second pattern 271 may have features similar to the first pattern 255 as discussed above. In some embodiments, the second pattern 271 contains a square pattern. Likewise, the second pattern 271 can be transferred to the top layer 267 via exposure to a radiation beam 257 with the exposed portion of the top layer 267 being removed. As a result, a second opening 273 is formed in the top layer 267. The second opening 273 formed in the top layer 267 is generally aligned with the source/drain region 292, as shown in FIG. 14. The second opening 273 may have a width similar, greater or smaller than the width of the first opening 247, depending upon the application.

Inset 275 in FIG. 14 is an enlarged top view of a portion of a pattern 277 of the second photomask 269 used to pattern the top layer 267 according to some embodiments. The second photomask 269 may be suitable for exposure with DUV radiation such as ArF excimer laser (193 nm) or KrF excimer laser (248 nm). The pattern 277 includes a plurality of features 279a, 279b, 279c, 279d, which can be lines, squares, grids, or any desired shape such as polygons, depending on the features to be formed in the top layer 267. In some embodiments, the features 279a, 279b, 279c, 279d are a square-shape pattern. It is contemplated that four features and their arrangement are shown for illustrative purposes. The features 279a, 279b, 279c, 279d can be repetitive on the second photomask 269, depending on the application and the features to be formed in the semiconductor device 240. The features 279a, 279b, 279c, 279d may be to provide openings for contacts that provide electrical connection to source/drain regions and/or gate for the semiconductor device 240. For example, the feature 279a may be a square-shape pattern corresponding to a portion of a first butted contact (e.g., the pattern 158B of the butted contact 158, as shown in FIG. 1B). The feature 279b may be a square-shape pattern corresponding to a portion of a second butted contact (e.g., the pattern 159B of the butted contact 159, as shown in FIG. 1B). The features 279c, 279d may be a square-shape pattern corresponding to contact features (e.g., the contact pattern 160A as shown in FIG. 1B). The features 279a, 279b of the second photomask 269 and the features 293a, 293b from the first photomask 249 are recombined to produce a rectangular-shape butted contact (e.g., butted contacts 158, 159 as shown in FIG. 1B) which is to be transferred to a target layer (e.g., the second SAC 233). By breaking a layout into multiple different masks, (e.g., first photomask 249 and the second photomask 269), features can be formed separately on a single layer using multiple masks in succession. Therefore, a minimum line spacing in the combined pattern can be reduced while maintaining good resolution.

It should be understood that the features 293a, 293b, 293c, 293d and the features 279a, 279b, 279c, 279d discussed in this disclosure can be any shape and/or arranged in any desired configuration of patterns so long as the combination of the features 293a, 293b, 293c, 293d and the features 279a, 279b, 279c, 279d produce a pre-determined, completed shape of the butted contacts and/or other contact features desired in the semiconductor device 240.

After the top layer 267 is patterned, the middle layer 265 and the bottom layer 263 can be patterned in a similar fashion as discussed above with respect to FIGS. 11 and 12 using the patterned top layer 267 as a mask, thereby transferring the second opening 273 to the bottom layer 263. Thereafter, the second hard mask layer 237 can be patterned in a similar fashion as discussed above with respect to FIGS. 11 and 12 using the patterned structure 261 as a mask. The bottom layer 263 in the first contact opening 259 remains at this stage. Then, an etch process can be performed to transfer the modified second opening 273 from the second hard mask layer 237 to the first hard mask layer 235 in a similar fashion as discussed above with respect to FIG. 12.

Figure 15:
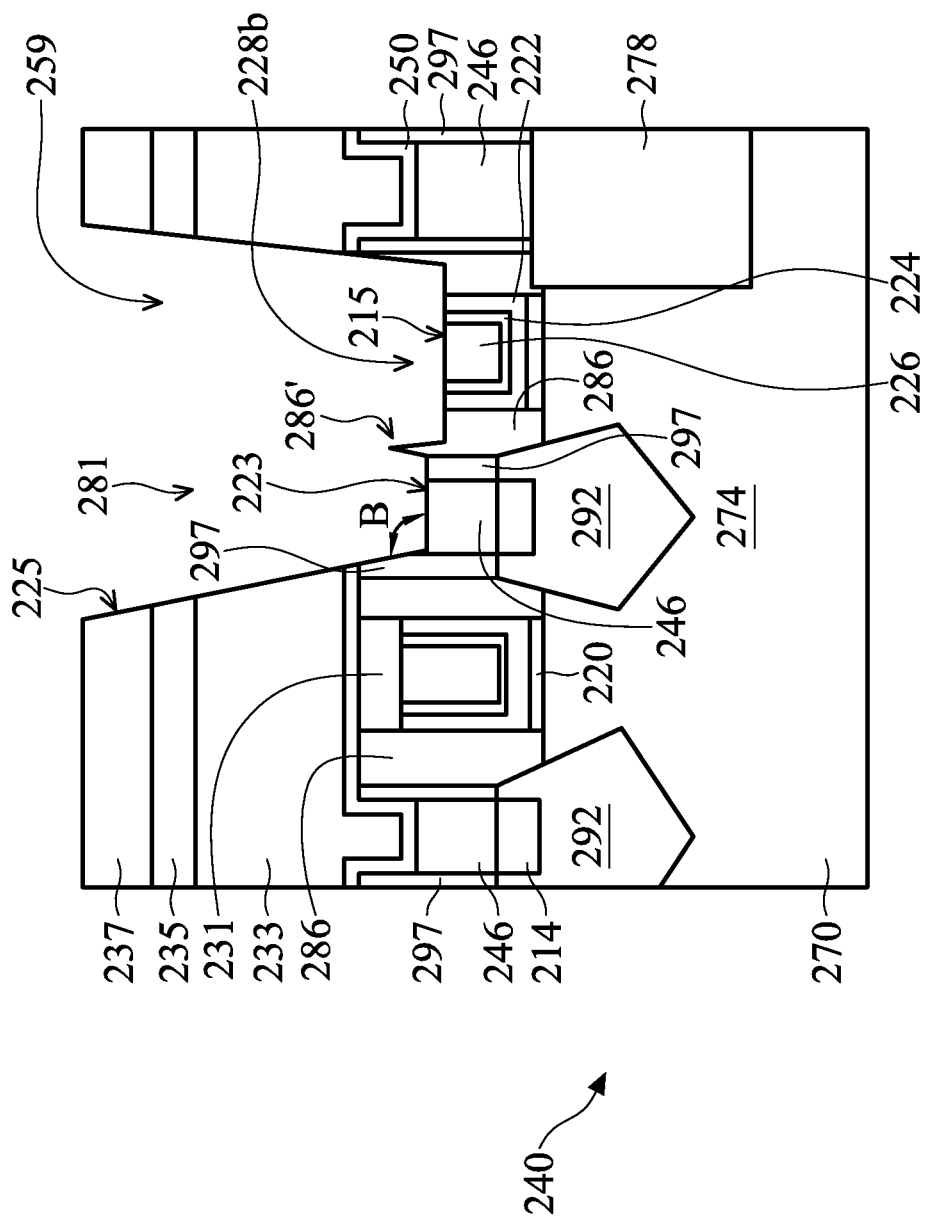

FIG. 15 illustrates the formation of a second contact opening 281 through the second SAC 233 and the protective liner 250. One or more etch processes are then performed to remove portions of the second SAC 233 and the protective liner 250 using the patterned second hard mask 237, the patterned first hard mask layer 235 (and in some case remaining portion of the bottom layer 263 in the first contact opening 259) as a mask, thereby forming the second contact opening 281 with an angled profile. The second contact opening 281 exposes at least the top surface of the conductive material 246. A first etch process, such as the first dry etch process used for removing the second SAC 233 as discussed above with respect to FIG. 13, may be used to remove the second SAC 233. A second etch process, such as the second dry etch process used for removing the protective liner 250 as discussed above with respect to FIG. 13, may be used to remove the protective liner 250. The bottom layer 263 remaining in the first contact opening 259 can be removed after the etch processes using a suitable strip process, such as an ashing process.

The second contact opening 281 has a bottom 223 and a sidewall 225 extending upwardly from the bottom 223. The sidewall 225 may be at an angle "B" with respect to the bottom 223. In some embodiments, the angle "B" is in a range between 91° to about 100°, such as about 92° to about 95°, for example about 93° to about 94°. The angle "B" may vary depending upon the parameters used by the etch process(es) during the formation of the second contact opening 281.

FIG. 15 depicts the first contact opening 259 and the second contact opening 281. The first contact opening 259 and the second contact opening 281 together expose portions of the conductive material 246, the first ILD 297, the gate conductive fill material 226, the gate dielectric layer 222, one or more optional conformal layers 224, and the gate spacers 286. The combination of the first contact opening 259 and the second contact opening 281 provide a contact opening for a butted contact, such as the butted contacts 158 and 159 as shown in FIG. 1B. Particularly, the gate spacer 286 left between the replacement gate structure 228b and the source/drain region 292 is formed with a tapered top portion 286' due to the angled sidewalls of the first and second contact openings 259, 281.

Figure 16:
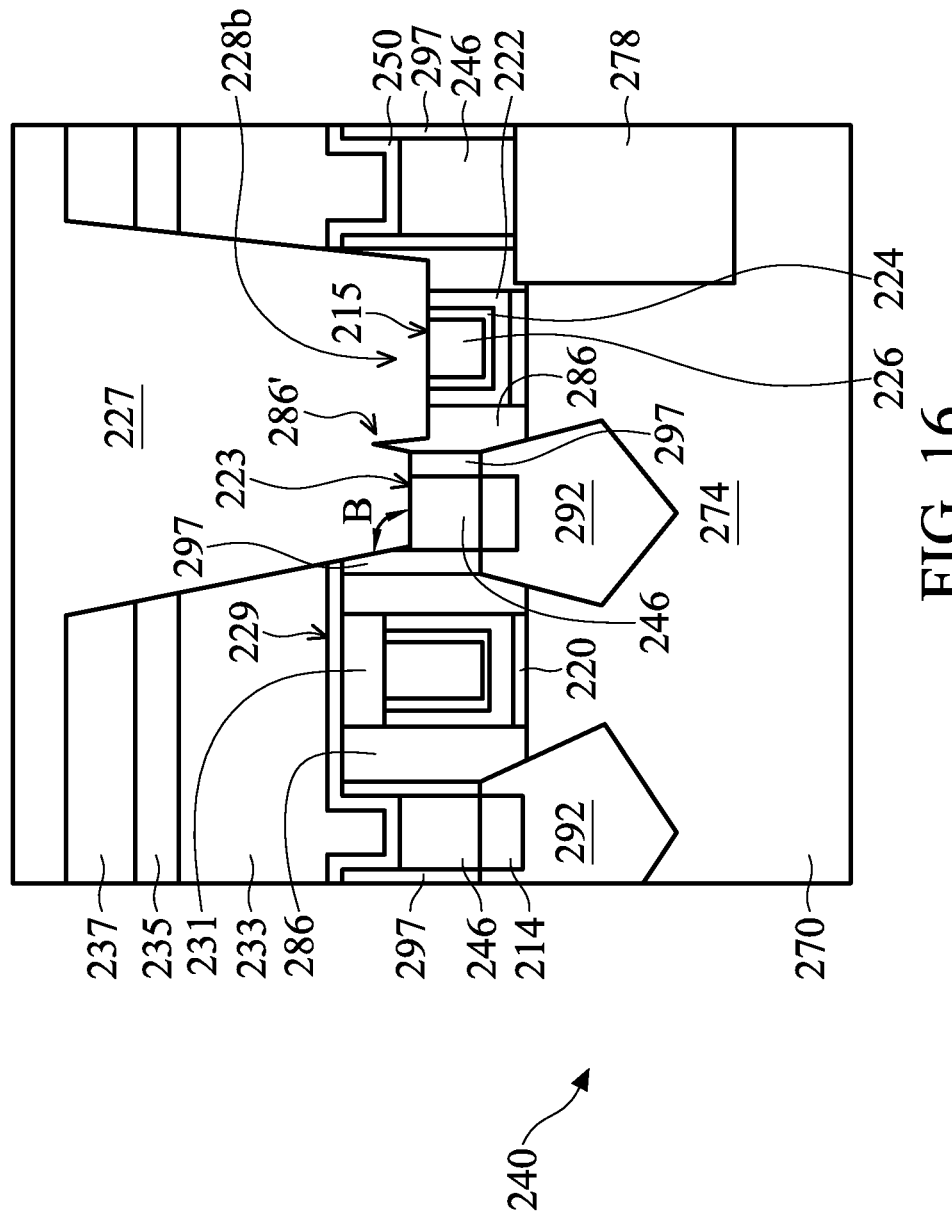
Figure 17A:
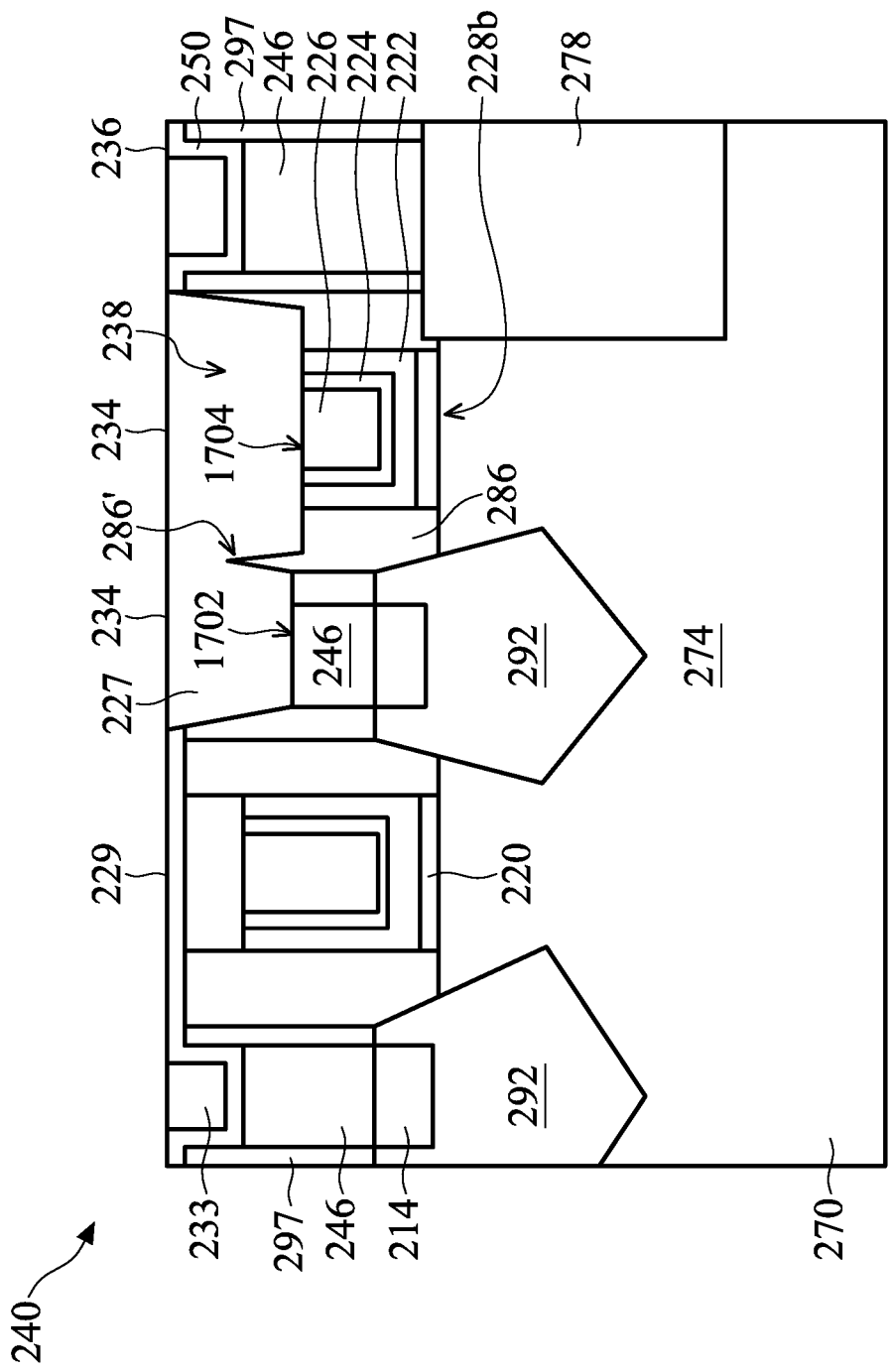
Figure 17B:
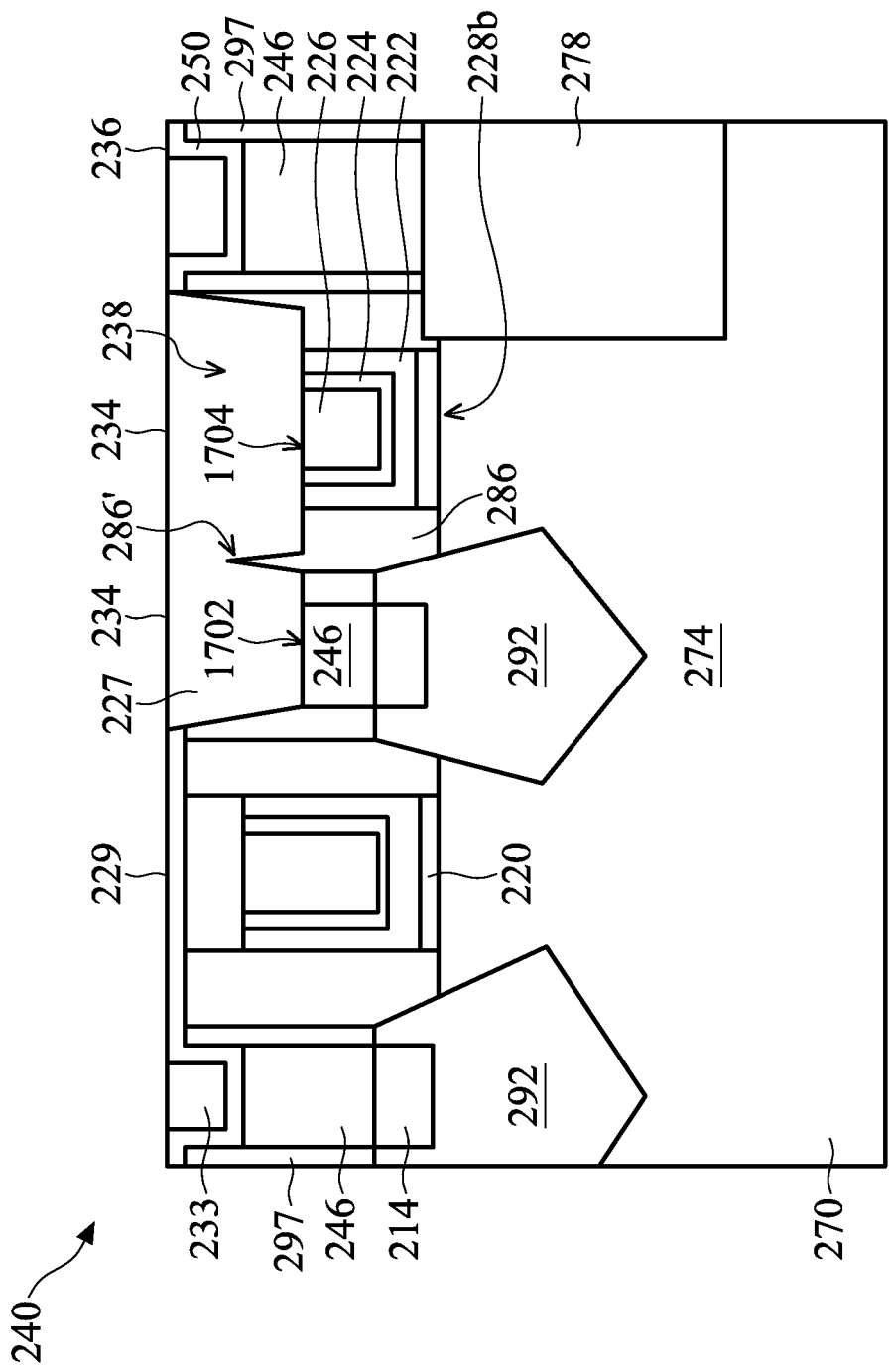

FIG. 16 illustrates filling the first and second contact openings 259, 281 (collectively referred to as a butted contact opening 238) with a conductive fill 227 (e.g., contact metal). The conductive fill 227 may be or include tungsten, cobalt, copper, ruthenium, aluminum, gold, silver, alloys thereof, the like, or a combination thereof, and may be deposited by PVD, ECP, ALD, CVD, or any suitable deposition technique. In some cases, a barrier/adhesion layer (not shown) may be conformally deposited on exposed surfaces of the butted contact opening 238. The barrier/adhesion layer may include or be titanium nitride, titanium-silicon nitride, titanium-carbon nitride, titanium-aluminum nitride, tantalum nitride, tantalum-silicon nitride, tantalum-carbon nitride, tungsten nitride, tungsten carbide, tungsten-carbon nitride, the like, or a combination thereof, and may be deposited by ALD, PECVD, MBD, or any suitable deposition technique. After the conductive fill 227 is deposited, excess conductive fill 227 may be removed by using a planarization process, such as a CMP, for example. The planarization process may remove excess conductive fill 227, the second hard mask layer 237, the first hard mask layer 235, and the second SAC 233 until the top surface 229 of the protective liner 250 is exposed. FIG. 17A illustrates the top surface 229 of the protective liner 250, the top surface 234 of the conductive fill 227, and the top surface 236 the second SAC 233 are substantially coplanar after the planarization process. The butted contact opening 238 generally has a first bottom 1702 extending across and over the source/drain region 292 and a second bottom 1704 extending across and over the replacement gate structure 228b. A tapered feature (e.g., the tapered top portion 286' of the gate spacer 286) is disposed between the first bottom 1702 and the second bottom 1704 and extends upwardly from between the source/drain region 292 and the replacement gate structure 228b. While the first bottom 1702 is shown higher than the second bottom 1704, the first bottom 1702 may be at the same elevation as the second bottom 1704, or even lower than the second bottom 1704, depending on the process receipts and/or application. FIG. 17B illustrates one embodiment where the first bottom 1702 and the second bottom 1704 are at the same elevation. The conductive fill 227 in the butted contact opening 238 enables electrical connection between the conductive material 246 contacting the source/drain region 292 and the gate conductive fill material 226 of the replacement gate structure 228b without the use of a horizontal metal interconnect layer. As a result, a shared or butted contact, such as the butted contacts 158 and 159 as shown in FIG. 1B, is obtained.

After the conductive fill 227 is formed in the butted contact opening 238, the structure may undergo further processing to form various features and regions needed to complete a SRAM cell. For example, subsequent processing may form additional contacts/vias/lines and multilayers of interconnect features (e.g., metal layers and interlayer or intermetal dielectrics) on the substrate 270, configured to connect the various features to form a functional circuit that may include one or more devices.

Figure 18:
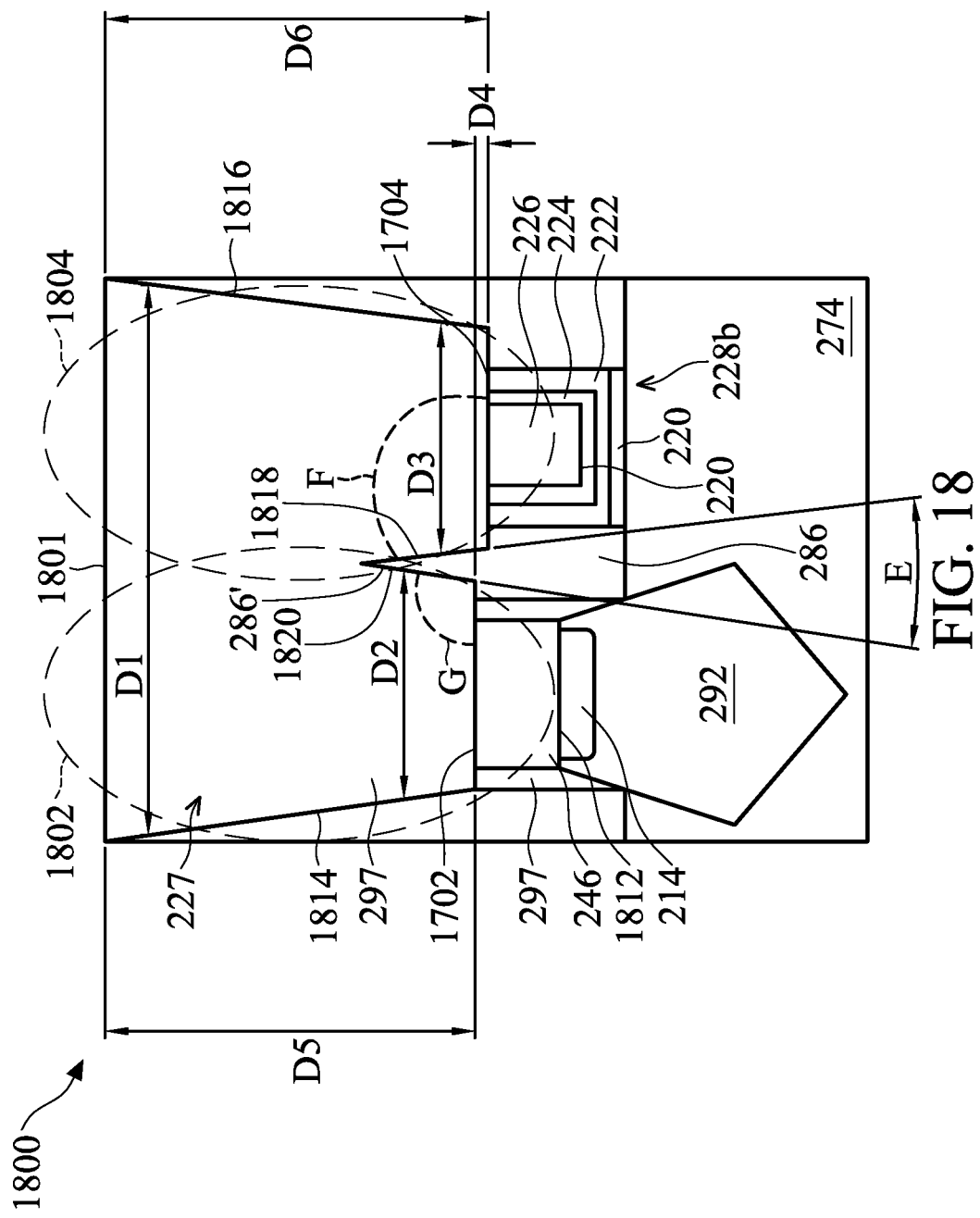
FIG. 18 depicts a portion of the cross-sectional view of FIG. 17A to further illustrate additional details in accordance with some embodiments.

FIG. 18 depicts a portion of the cross-sectional view of FIG. 17A to further illustrate additional details in accordance with some embodiments. It should be understood that FIG. 18 is not drawn in scale for ease of illustration purposes. The butted contact structure 1800 can be considered as a W-shaped structure having a left V-shaped part 1802 and a right V-shaped part 1804. The butted contact structure 1800 has a first dimension D1 along a top surface 1801 of the butted contact structure 1800. The left V-shaped part 1802 has a second dimension D2 along the bottom 1702 of the left V-shaped part 1802. The right V-shaped part 1804 has a third dimension D3 along the bottom 1704 of the right V-shaped part 1804. The ratio of the second dimension D2 to the first dimension D1 can be in a range from about 1:1.5 to about 1:3, and the ratio of the third dimension D3 to the first dimension D1 can be in a range from about 1:1.5 to about 1:3. The bottom 1702 of the left V-shaped part 1802 and the bottom 1704 of the right V-shaped part 1804 may be non-coplanar. In the embodiment shown in FIG. 18, the bottom 1702 of the left V-shaped part 1802 is relatively higher than the bottom 1704 of the right V-shaped part 1804 by a fourth dimension D4. The fourth dimension D4 can be in a range from about −5 nm to about 5 nm. In other words, the bottom 1702 of the left V-shaped part 1802 may also be lower than the bottom 1704 of the right V-shaped part 1804. The left V-shaped part 1802 has a fifth dimension D5 measuring from the top surface 1801 to the bottom 1702 of the left V-shaped part 1802. The right V-shaped part 1804 has a sixth dimension D6 measuring from the top surface 1801 to the bottom 1704 of the right V-shaped part 1804. A ratio of the fifth dimension D5 to the sixth dimension D6 can be in a range from about 0.9:1 to about 1.2:1, for example about 1:1.

The left V-shaped part 1802 has a sidewall 1814 extending between the top surface 1801 of the butted contact structure 1800 and the bottom 1702 of the left V-shaped part 1802. The right V-shaped part 1804 has a sidewall 1816 extending between the top surface 1801 of the butted contact structure 1800 and the bottom 1704 of the right V-shaped part 1804. A gate spacer 286 is disposed between the source/drain region 292 and the replacement gate structure 228b. The gate spacer 286 has a tapered portion 286' separating the left V-shaped part 1802 and the right V-shaped part 1804. In other words, the bottom 1702 of the left V-shaped part 1802 and the bottom 1704 of the right V-shaped part 1804 are not contiguous. The tapered portion 286' has a first sidewall 1818 and a second sidewall 1820 intersecting the first sidewall 1818 at an angle "E" that is greater than 0°, for example about 2° to about 20°. The first sidewall 1818 is at an angle "F" with respect to the bottom 1704 of the right V-shaped part 1804. The second sidewall 1820 is at an angle "G" with respect to the bottom 1702 of the left V-shaped part 1802. The angle "F" can be in a range from 91° to about 100°, for example about 92° to about 95°. The angle "G" can be in a range from 91° to about 100°, for example about 92° to about 95°.

Various embodiments described herein may offer several advantages. It will be understood that not all advantages have been necessarily described herein, no particular advantage is required for any embodiment, and other embodiments may offer different advantages. As an example, embodiments described herein provide an improved butted contact structure that enables connection of one or more gates to one or more active regions without the use of a horizontal metal interconnect layer. The butted contact structure between gate contacts and source or drain contacts can all be formed by a double patterning process using two separate photomasks, each with half of a pattern corresponding to the shared or butted contact structure. By reducing the total number of photomasks to two, the number of alignments of photomasks is reduced, and reduction in yield caused by misalignment with another photomask is suppressed. As a result, manufacturing cost can be reduced and throughput can be improved. In addition, the improved butted contact structure has a tapered gate spacer extruding into a bottom of the butted contact structure. The tapered gate spacer along with the angled sidewalls of the butted contact structure can ensure good metal-fill capability for the subsequent deposited metal fill. Therefore, the metal fill can be fully deposited in the butted contact structure without voids or seams.

In an embodiment, a structure is provided. The structure includes a first transistor on a substrate, the first transistor comprising a first source or drain region, a first gate, and a first gate spacer being disposed between the first gate and the first source or drain region. The structure also includes a second transistor on the substrate, the second transistor comprising a second source or drain region, a second gate, and a second gate spacer being disposed between the second gate and the second source or drain region. The structure further includes a butted contact disposed above and extending from the first source or drain region to at least one of the first gate or the second gate, a portion of the first gate spacer extending a distance into the butted contact to separate a first bottom surface of the butted contact from a second bottom surface of the butted contact.

In another embodiment, a structure includes a first transistor on a substrate, the first transistor comprising a source or drain region, a conductive feature contacting the source or drain region, a gate electrode of a gate structure of a second transistor on the substrate. The structure also includes a butted contact comprising (i) a first surface contacting the gate electrode, (ii) a second surface contacting the conductive feature, (iii) a third surface extending at a first angle from the first surface, and (iv) a fourth surface extending at a second angle from the second surface, the third surface intersecting the fourth surface at a third angle. The structure further includes a gate spacer disposed between the source or drain region and the gate structure, a portion of the gate spacer being disposed laterally between the third surface and the fourth surface.

In one another embodiment, a method for semiconductor processing is provided. The method includes forming a source or drain region of a first transistor on a substrate, a gate of a second transistor on the substrate, and a gate spacer on a side of the gate, wherein the source or drain region has a conductive feature formed thereon, the gate has a first dielectric layer formed thereon, and the gate spacer is disposed laterally between the gate and the source or drain region, depositing a second dielectric layer over the conductive feature, the first dielectric layer, and the gate spacer, wherein the second dielectric layer is different from the first dielectric layer, depositing a first mask layer over the second dielectric layer, depositing a second mask layer over the first mask layer, etching a first contact opening through the second mask layer, the first mask layer, the second dielectric layer, and the first dielectric layer to expose the gate, etching the first contact opening comprising using a first etch recipe to etch the second dielectric layer, and a fourth etch recipe to etch the first dielectric layer, wherein the first, second, third, and fourth etch recipes are different from each other, etching a second contact opening through the second mask layer, the first mask layer, and the second dielectric layer to expose the conductive feature, etching the second contact opening comprising using the first etch recipe to etch the second mask layer, the second etch recipe to etch the first mask layer, the third etch recipe to etch the second dielectric layer, the first contact opening and the second contact opening joining at the gate spacer, and the first etch recipe and the second etch recipe shaping a portion of the gate spacer into a tapered profile, and filling the first contact opening and the second contact opening with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   forming a first transistor on a substrate, the first transistor comprising a source/drain region, a gate structure, and a spacer along a sidewall of the gate structure;
   forming a contact to the source/drain region;
   forming a one or more dielectric layers over the first transistor and the contact; and
   after forming the one or more dielectric layers, forming a butted contact opening through the one or more dielectric layers, forming the butted contact opening comprising:
      forming a first opening in the one or more dielectric layers to the contact using a first process and a second opening in the one or more dielectric layers to the gate structure using a second process, wherein the first process and the second process are performed sequentially, wherein a sidewall of the first opening comprises the spacer, wherein a sidewall of the second opening comprises the spacer; and
   forming a conductive material in the butted contact opening.

2. The method of claim 1, wherein forming the first opening and the second opening comprises:
   forming one of the first opening and the second opening;
   filling the one of first opening the second opening with a sacrificial material;
   forming an other of the first opening and the second opening; and
   removing the sacrificial material, thereby forming the butted contact opening.

3. The method of claim 2, wherein filling the one of first opening the second opening with the sacrificial material completely fills the one of first opening the second opening.

4. The method of claim 1 further comprising recessing the contact.

5. The method of claim 4, wherein recessing the contact is performed prior to forming the one or more dielectric layers, wherein recessing forms a recess.

6. The method of claim 5, wherein forming the one or more dielectric layers comprises:
   forming a first dielectric layer in the recess and over the gate structure; and
   forming a second dielectric layer over the first dielectric layer, the second dielectric layer extending into the recess.

7. The method of claim 6, wherein forming the conductive material comprises:
   forming a conductive layer in the first opening and the second opening, wherein the conductive layer extends over the one or more dielectric layers; and planarizing the conductive layer and the one or more dielectric layers.

8. The method of claim 7, wherein portions of the first dielectric layer remains along a sidewall of the conductive material after planarizing.

9. The method of claim 1, wherein the first opening overlaps the second opening.

10. A method for semiconductor processing, the method comprising:
forming a first dielectric layer over a first conductive feature and a second conductive feature;
patterning the first dielectric layer to form a first contact opening, the first contact opening exposing the first conductive feature;
filling the first contact opening with a dielectric material;
patterning the first dielectric layer to form a second contact opening, the second contact opening exposing the second conductive feature, the second contact opening merging with the first contact opening;
removing the dielectric material to form a merged contact opening; and
filling the merged contact opening with conductive material to form a butted contact.

11. The method of claim 10, wherein one of the first conductive feature and the second conductive feature comprises a contact to a source/drain region, wherein an other of the first conductive feature and the second conductive feature comprises a gate electrode.

12. The method of claim 10, wherein the first conductive feature or the second conductive feature comprises a gate structure, wherein the gate structure comprises a gate electrode and a spacer adjacent the gate electrode, wherein the butted contact extends along opposing sidewalls of the spacer.

13. The method of claim 12, wherein patterning to form the first contact opening comprises recessing a portion of an upper surface of the spacer.

14. The method of claim 12, wherein patterning to form the second contact opening comprises recessing a portion of an upper surface of the spacer.

15. The method of claim 10 further comprising removing at least a portion of the first dielectric layer after filling the merged contact opening with the conductive material.

16. A method for semiconductor processing, the method comprising:
forming a first conductive region and a second conductive region on a semiconductor substrate, wherein the first conductive region and the second conductive region are separated by a first dielectric layer along a line parallel to a major surface of the semiconductor substrate, wherein the line parallel to the major surface of the semiconductor substrate intersects the first conductive region and the second conductive region;
forming one or more second dielectric layers over the first conductive region, the second conductive region, and the first dielectric layer;
forming a butted contact opening through the one or more second dielectric layers to the first conductive region and the second conductive region, wherein the first dielectric layer protrudes above a bottom of the butted contact opening; and
filling the butted contact opening with a conductive material to form a butted contact.

17. The method of claim 16, wherein a first interface between the butted contact and the first conductive region is lower than a second interface between the butted contact and the second conductive region.

18. The method of claim 16, wherein the conductive material has a first interface with the first conductive region, wherein the conductive material has a second interface with the second conductive region, wherein a vertical distance between the first interface and the second interface is less than about 5 nm.

19. The method of claim 16, wherein the first dielectric layer has angled sidewalls that intersect at an angle between about 2° to about 20°.

20. The method of claim 16, wherein the first dielectric layer is a spacer interposed between a gate structure and a source/drain region.

* * * * *